United States Patent
Kato et al.

(10) Patent No.: US 12,040,303 B2
(45) Date of Patent: Jul. 16, 2024

(54) SEMICONDUCTOR DEVICE AND INSPECTION DEVICE

(71) Applicant: KABUSHIKI KAISHA TOSHIBA, Tokyo (JP)

(72) Inventors: Mitsuaki Kato, Kawasaki Kanagawa (JP); Takahiro Omori, Kawasaki Kanagawa (JP); Akihiro Goryu, Kanazawa Ishikawa (JP); Tomoya Fumikura, Kawasaki Kanagawa (JP); Kenji Hirohata, Koto Tokyo (JP); Tetsuya Kugimiya, Kawasaki Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 904 days.

(21) Appl. No.: 17/005,362

(22) Filed: Aug. 28, 2020

(65) Prior Publication Data
US 2021/0296279 A1    Sep. 23, 2021

(30) Foreign Application Priority Data

Mar. 17, 2020    (JP) ................. 2020-046497

(51) Int. Cl.
G01R 31/66    (2020.01)
G01R 27/08    (2006.01)
H01L 23/00    (2006.01)

(52) U.S. Cl.
CPC ............ *H01L 24/48* (2013.01); *G01R 27/08* (2013.01); *G01R 31/66* (2020.01); *H01L 24/49* (2013.01); *H01L 2224/45111* (2013.01); *H01L 2224/45123* (2013.01); *H01L 2224/45124* (2013.01); *H01L 2224/45155* (2013.01); *H01L 2224/45157* (2013.01); *H01L 2224/45166* (2013.01); *H01L 2224/45179* (2013.01); *H01L 2224/4518* (2013.01); *H01L 2224/45181* (2013.01); *H01L 2224/45184* (2013.01); *H01L 2224/4813* (2013.01); *H01L 2224/48458* (2013.01); *H01L 2224/4852* (2013.01); *H01L 2224/48723* (2013.01); *H01L 2224/48747* (2013.01);
(Continued)

(58) Field of Classification Search
CPC ..... G01R 31/66; G01R 27/08; H01L 2224/13; H01L 2224/16225; H01L 24/49
See application file for complete search history.

(56) References Cited

U.S. PATENT DOCUMENTS 6,156,626 A * 12/2000 Bothra .............. H01L 24/05
257/E21.511
6,620,720 B1    9/2003 Moyer et al.
(Continued)

FOREIGN PATENT DOCUMENTS

GB    2 105 107 A    3/1983
GB    2 149 574 A    6/1985
(Continued)

*Primary Examiner* — Thang X Le
(74) *Attorney, Agent, or Firm* — Finnegan, Henderson, Farabow, Garrett & Dunner, LLP

(57) ABSTRACT

A semiconductor device 10 includes a pair of electrodes 16 and a conductive connection member 21 electrically bonded to the pair of electrodes 16. At least a portion of a perimeter of a bonding surface 24 of at least one of the pair of electrodes 16 and the conductive connection member 21 includes an electromigration reducing area 22.

16 Claims, 16 Drawing Sheets

(52) U.S. Cl.
CPC ......... *H01L 2224/48755* (2013.01); *H01L 2224/48757* (2013.01); *H01L 2224/48766* (2013.01); *H01L 2224/48779* (2013.01); *H01L 2224/4878* (2013.01); *H01L 2224/48781* (2013.01); *H01L 2224/48784* (2013.01); *H01L 2224/48823* (2013.01); *H01L 2224/48824* (2013.01); *H01L 2224/48855* (2013.01); *H01L 2224/48857* (2013.01); *H01L 2224/48866* (2013.01); *H01L 2224/48879* (2013.01); *H01L 2224/4888* (2013.01); *H01L 2224/48881* (2013.01); *H01L 2224/48884* (2013.01); *H01L 2224/49111* (2013.01); *H01L 2224/49175* (2013.01); *H01L 2924/01014* (2013.01); *H01L 2924/0106* (2013.01); *H01L 2924/01087* (2013.01)

(56) References Cited

U.S. PATENT DOCUMENTS

| | | | | |
|---|---|---|---|---|
| 2008/0191357 | A1* | 8/2008 | Kouno | H01L 24/11 257/762 |
| 2013/0164956 | A1* | 6/2013 | Sakuyama | H01L 23/49866 439/83 |
| 2014/0054766 | A1* | 2/2014 | Hashino | B23K 35/025 257/737 |
| 2014/0217595 | A1* | 8/2014 | Sakurai | B23K 35/262 257/772 |
| 2017/0259366 | A1* | 9/2017 | Ishikawa | H01L 24/13 |

FOREIGN PATENT DOCUMENTS

| | | |
|---|---|---|
| JP | S58-17629 A | 2/1983 |
| JP | S64-82644 | 3/1989 |
| JP | H5-326615 A | 12/1993 |
| JP | H6-302639 A | 10/1994 |
| JP | 2001-351940 A | 12/2001 |
| JP | 2009-76703 A | 4/2009 |
| JP | 2012-142488 A | 7/2012 |
| JP | 2014-11259 A | 1/2014 |
| JP | 2014-78627 A | 5/2014 |
| JP | 2016-138784 A | 8/2016 |
| JP | 2017-5118 A | 1/2017 |

* cited by examiner

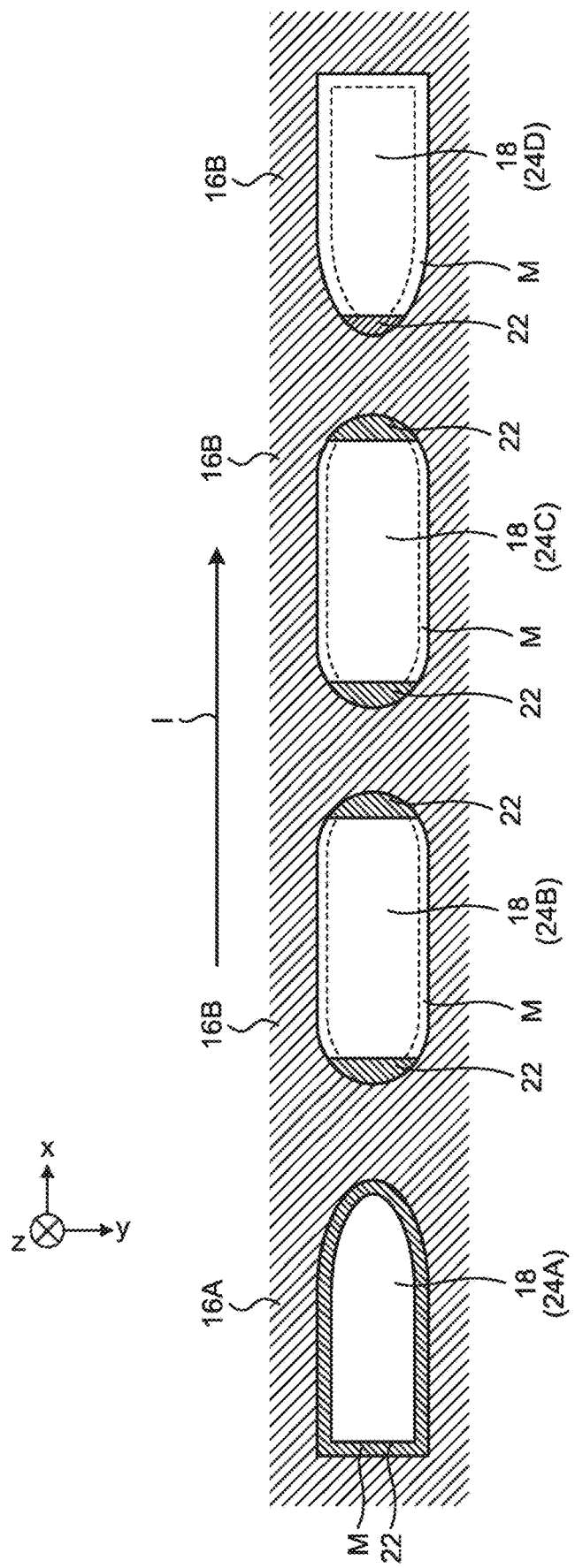

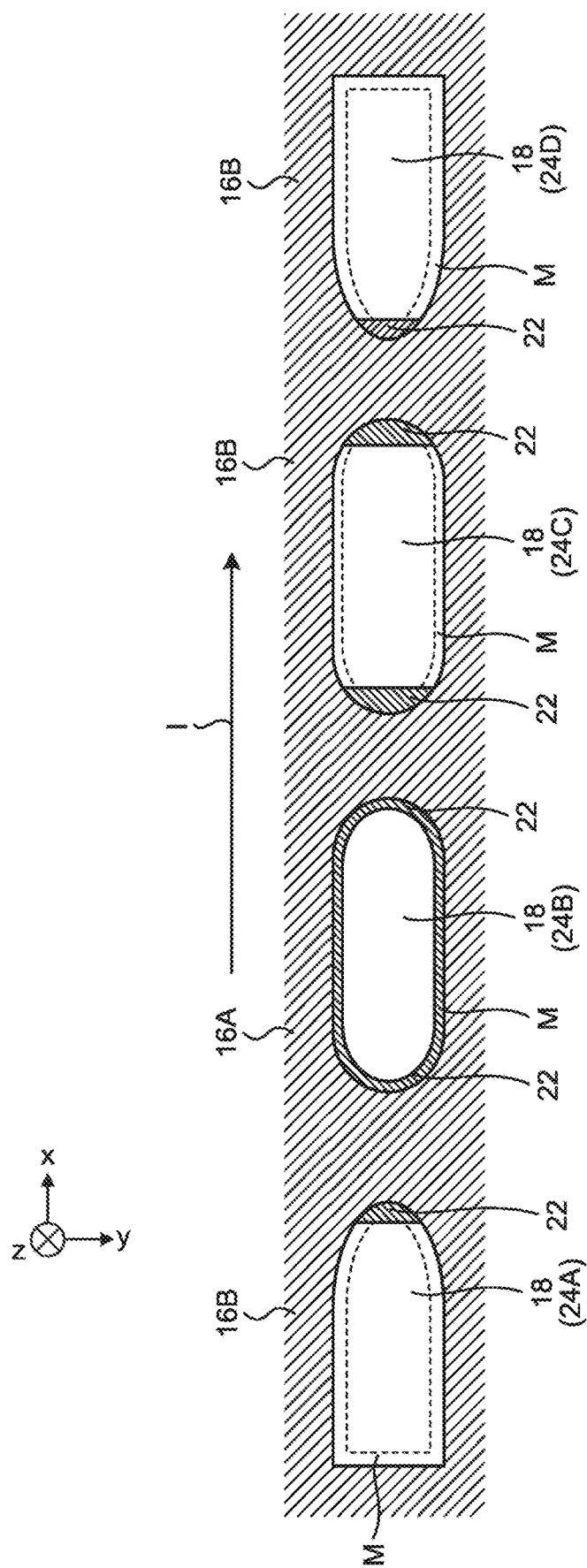

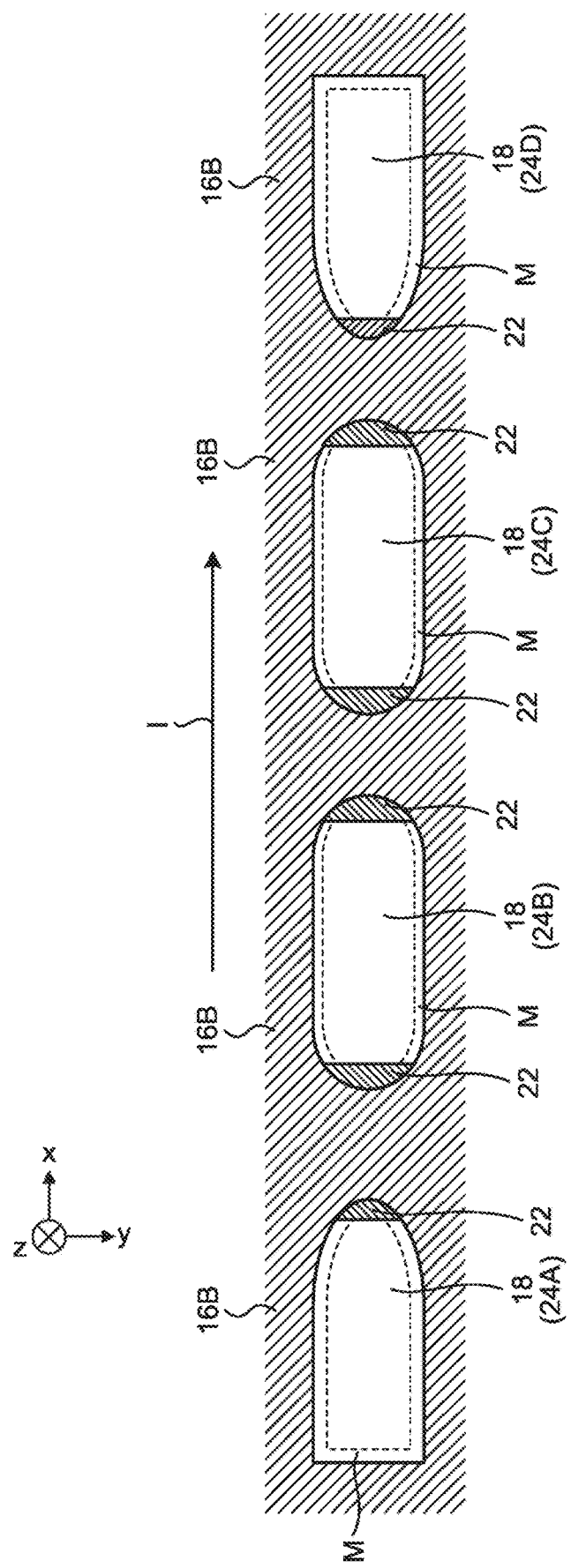

SEMICONDUCTOR DEVICE AND INSPECTION DEVICE

CROSS-REFERENCE TO RELATED APPLICATIONS

This application is based upon and claims the benefit of priority from Japanese Patent Application No. 2020-046497, filed on Mar. 17, 2020; the entire contents of which are incorporated herein by reference.

FIELD

Embodiments described herein relate generally to a semiconductor device and an inspection device.

BACKGROUND

Power modules composed of various semiconductor devices are widely used as core components in power electronics fields, and are being researched and developed for smaller size and higher power. To achieve the smaller size and the higher power, the power modules need to have a higher current density and higher heat resistance performance. However, the increase in the current density and the rise in the operating temperature lead to a concern about occurrence of electromigration.

For example, a configuration of setting a diameter of wires and a length of a bonding portion of wire bonding to specific dimensions and a configuration of providing a nickel film on an aluminum electrode are disclosed as technologies to reduce the electromigration. However, by the conventional technologies, there are cases where effective reduction of the occurrence of the electromigration is difficult.

The embodiments herein are attained in view of the above, and an object thereby is to provide a semiconductor device and an inspection device capable of effectively reducing the occurrence of the electromigration.

BRIEF DESCRIPTION OF THE DRAWINGS

FIG. 6A is a schematic view of a plurality of bonding surfaces according to another modification;

FIG. 6B is another schematic view of the bonding surfaces according to the other modification;

FIG. 6C is still another schematic view of the bonding surfaces according to the other modification;

DETAILED DESCRIPTION

A semiconductor device includes a pair of electrodes and a conductive connection member electrically bonded to the pair of electrodes. At least a portion of a perimeter of a bonding surface of at least one of the pair of electrodes and the conductive connection member includes an electromigration reducing area. The following describes details of embodiments with reference to the accompanying drawings.

First Embodiment

Figure 1:
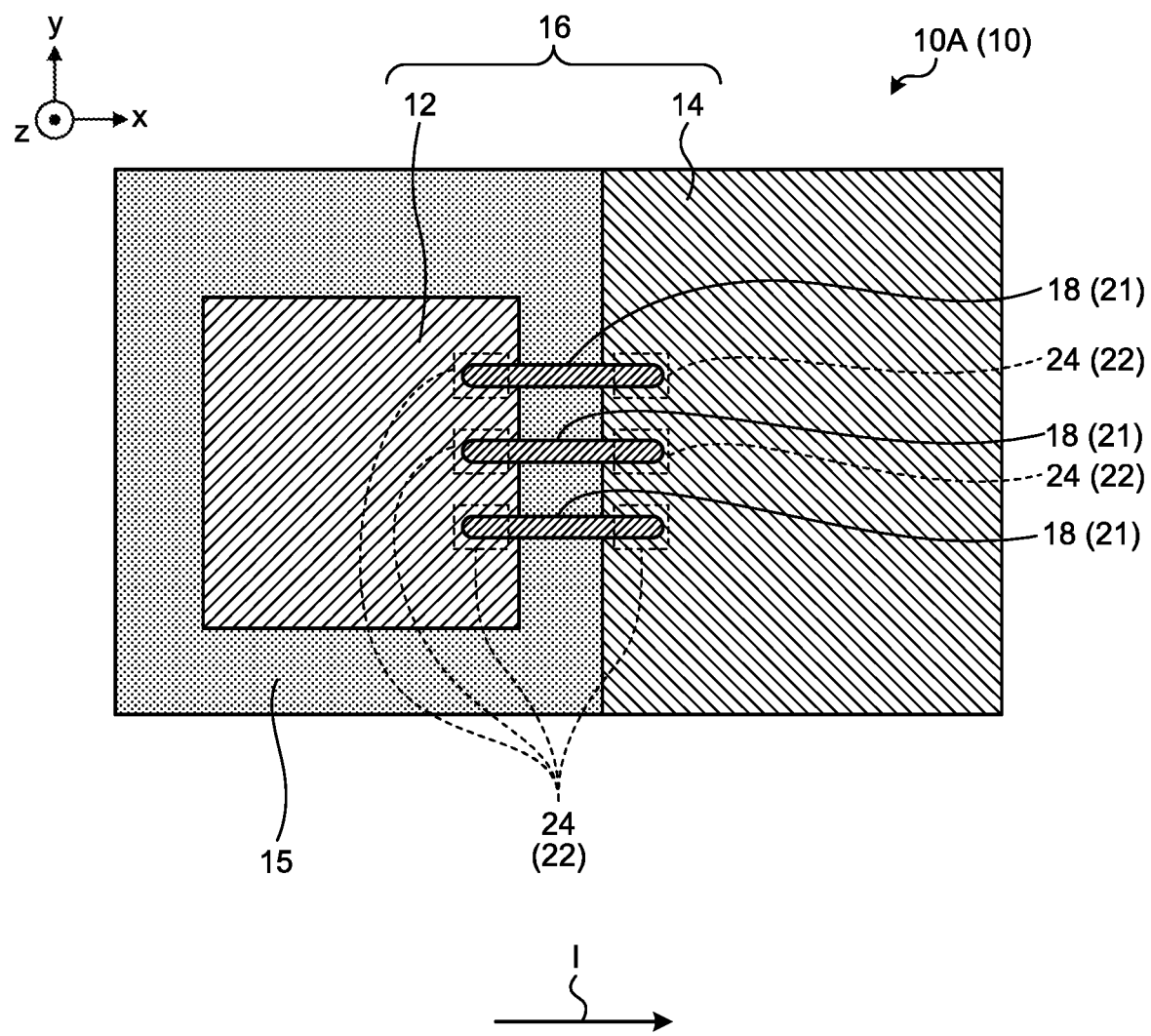
FIG. 1 is a schematic view of a semiconductor device according to a first embodiment.
Figure 2:
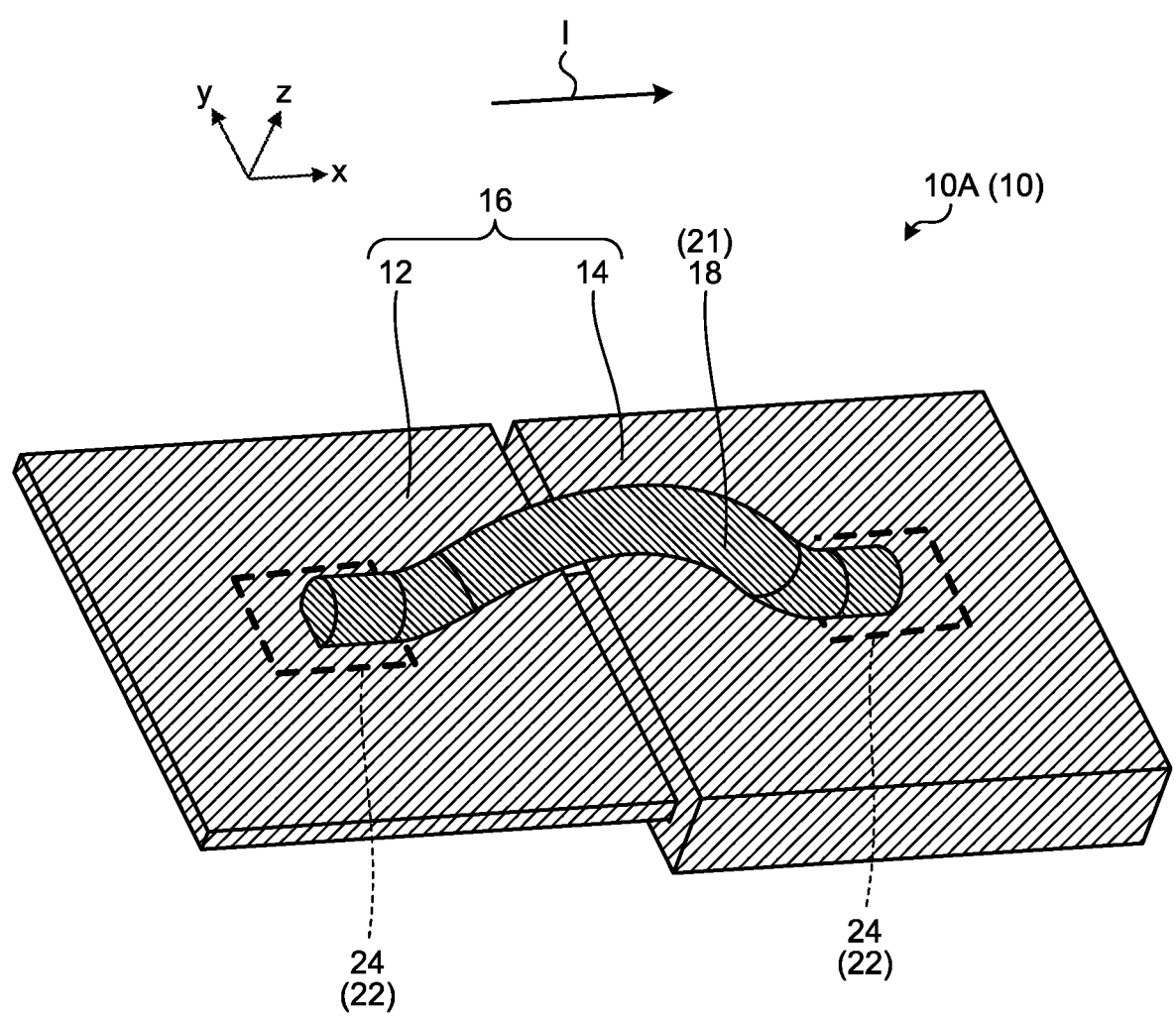
FIG. 2 is another schematic view of the semiconductor device according to the first embodiment.

FIGS. 1 and 2 are schematic views illustrating an example of a semiconductor device 10A according to a first embodiment. In the present embodiment and the embodiments to be described later, the semiconductor device 10A and semiconductor devices of the embodiments to be described later may each be called a semiconductor device 10 when they are collectively described.

The semiconductor device 10A includes a pair of electrodes 16 and conductive connection members 21. Each of the pair of electrodes 16 is electrically bonded to the conductive connection members 21 through bonding surfaces 24. The bonding surfaces 24 are areas including surfaces on which the electrode 16 is electrically bonded to the conductive connection members 21. That is, each of the bonding surfaces 24 includes a bonding surface of a wiring member 18 bonded to the electrode 16 and a bonding surface of the electrode 16 bonded to the wiring member 18. The pair of electrodes 16 are electrically connected onto, for example, a substrate 15. The substrate 15 is a substrate including at least one or more layers of each of an electrically insulating layer and an electrically conducting layer.

The pair of electrodes 16 includes a first electrode 12 and a second electrode 14. The present embodiment will be described by way of an example of a configuration in which the first electrode 12 serves as an anode, and the second electrode 14 serves as a cathode. Thus, the present embodiment will be described by way of an example in which a current direction I serving as a direction of a current (electrons) flowing through the wiring member 18 is a direction from the first electrode 12 to the second electrode 14. The present embodiment will be described by way of an example in which the current direction I is a direction substantially parallel to an x-axis direction.

On the first electrode 12 and the second electrode 14, at least the bonding surfaces 24 bonded to the conductive connection members 21 and areas continuing to the bonding surfaces 24 only need to be made of a conductive material.

For example, the first electrode 12 is a surface electrode of a semiconductor device. In this case, the surface electrode serving as the first electrode 12 only needs to be bonded to the conductive connection members 21. The second electrode 14 is, for example, an electrode of the substrate. Hereinafter, the electrode of the substrate may be called a substrate electrode. In that case, the substrate electrode only needs to be bonded to the conductive connection members 21.

A semiconductor of the semiconductor device is made of any semiconductor material, such as Si, Ge, SiC, GaN, SiGe, CdTe, ZnSe, CdS, HgCdTe, CdZnTe, GaAs, GaP, InP, GaAlAs, InGaAs, GaInNAS, or InGaAlP. At least a portion of an end face of the semiconductor includes an electrode (semiconductor electrode) serving as the above-mentioned surface electrode. The semiconductor electrode is made of any metal material, such as C, W, Cu, Ag, Au, Al, Ni, Pt, Fe, Ti, indium tin oxide (ITO), or Zno. The surface electrode generally has a planar shape.

A member connected to the surface electrode is not limited to the semiconductor. The electrical conductivity of the member connected to the surface electrode only needs to be lower than that of the wiring member 18 and the second electrode 14, and is preferably equal to or lower than half that of the wiring member 18 and the second electrode 14. The thickness of the surface electrode only needs to be smaller than the thickness of the second electrode 14, and is preferably equal to or smaller than half the thickness of the second electrode 14. The thickness of the surface electrode is, for example, 10 μm or smaller, but is not limited to this value.

the surface electrode may be plated. The type of the plating is not limited. The plating is made of a material, such as Ni, Zn, Cd, ICr, Cu, Ni, Cr, Au, Ag, Pb, or P.

The substrate electrode serving as the second electrode 14 is made of any metal material, such as C, W, Cu, Ag, Au, Al, Ni, Pt, Fe, Ti, ITO, or ZnO. The substrate electrode generally has a planar shape, and generally has a thickness of 10 μm or larger.

The second electrode 14 is not limited to the substrate electrode, and may have any shape made of, for example, a metal plate, a metal foil, a reed, a wire, a ribbon, or a bus bar. The metal plate, the metal foil, the reed, the wire, the ribbon, or the bus bar forming the substrate electrode may be covered with an insulating material except in portions to be connected to the wiring members 18. The metal plate, the metal foil, the reed, the wire, the ribbon, or the bus bar having any shape may be formed in advance before being bonded, or may be formed when being bonded.

The substrate electrode may be plated. The type of the plating is not limited. The plating is made of a material, such as Ni, Zn, Cd, ICr, Cu, Ni, Cr, Au, Ag, Pb, or P.

The conductive connection members 21 are members for electrically bonding the first electrode 12 to the second electrode 14. Each of the conductive connection members 21 is, for example, the wiring member 18. In the present embodiment, the case will be described as an example where the conductive connection member 21 is the wiring member 18.

The wiring member 18 is a member serving as a conductor for conducting electricity between the first electrode 12 and the second electrode 14. The wiring member 18 is, for example, a reed, a wire, a ribbon, or a bus bar.

A constituent material of the wiring member 18 is not limited, and only needs to be a conductive material. The wiring member 18 is made of any metal material, such as C, W, Cu, Ag, Au, Al, Ni, Pt, Fe, Ti, ITO, or ZnO. The constituent material of the wiring member 18 may be the same as, or different from that of at least one of the first electrode 12 and the second electrode 14.

The wiring member may be plated. The type of the plating is not limited. The plating is made of a material, such as Ni, Zn, Cd, ICr, Cu, Ni, Cr, Au, Ag, Pb, or P.

When an electromigration reducing area 22 to be described later is provided, the constituent material of each of the first electrode 12, the second electrode 14, and the wiring member 18 provided with the electromigration reducing area 22 refers to a material other than an additive to be described later, and corresponds to a base material to be described below. That is, in the present embodiment, the term "base material" is used as a meaning including all of the electrodes, such as the first electrode 12 and the second electrode 14, and the conductive connection member 21 (including the wiring member 18 and a bonding material to be described later).

The semiconductor device 10A of the present embodiment includes the electromigration reducing areas 22.

The term "electromigration" refers to a phenomenon in which an interaction between atoms in a conductor and electrons passing through the conductor causes the atoms to receive momentum of the electrons to move. In other words, the term "electromigration" refers to a phenomenon in which electrons flowing through a metal collide with metal atoms to transport the metal atoms. In still other words, the transportation of the metal atoms may generate, for example, voids or hillocks. As a result, the occurrence of the electromigration causes, for example, a disconnection, a short circuit, an insulation failure, and/or an increase in resistance at a portion where the metal atoms are reduced. An increase in strain and stress caused by the movement of the metal atoms can lead to mechanical deterioration, such as cracks. The electromigration reducing area 22 of the present embodiment is an area for reducing the occurrence of the electromigration.

In the present embodiment, the electromigration reducing area 22 is an additive containing area containing the additive. The additive is a material for reducing diffusion of the electromigration or reducing the electrical conductivity of the base material of the bonding surface 24. The diffusion of the electromigration of the base material refers to at least one of volume diffusion, surface diffusion, grain boundary diffusion, and dislocation diffusion. The base material of the bonding surface 24 refers to the constituent material of the wiring member 18 or the electrode 16 included in the bonding surface 24. That is, the electromigration reducing area 22 is an area to which the additive serving as a material different from the base material of the bonding surface 24 has been added.

The electromigration reducing area 22 is formed by adding the above-described additive to the bonding surface 24. Specifically, the electromigration reducing area 22 is formed by adding the above-described additive to the bonding surface 24 of at least one of the first electrode 12, the second electrode 14, and the wiring member 18. A known method only needs to be used as a method of the addition.

The additive may be added to at least a portion of the bonding surface 24 in advance before the bonding, or during the bonding, or after the bonding. The additive may be added a plurality of times, or may be separately added to a plurality of areas.

The additive is at least one type selected from the group comprising, for example, Al, Cu, Si, Ni, Cr, Mg, Au, Ag, Ta, Fe, a molybdenum-tungsten alloy (MoW), Ti, Be, Nd, Fr, Nb, and Co. Of these types, the additive is preferably at least one type selected from Cu, Si, Ni, Cr, Mg, Ta, Fe, Ti, Be, Nd, Fr, and Nb, and more preferably at least one type selected from Cu, Si, Ni, Cr, Mg, Ta, Ti, and Be, from the viewpoint of the reduction of the electromigration.

The type of the additive only needs to be adjusted as appropriate according to the base material of the bonding surface 24 to which the additive is to be added. The electromigration reducing area 22 is formed by adding the material different from the base material of the bonding surface 24 as the additive.

A case is assumed where the base material of the bonding surface 24 (that is, the electromigration reducing area 22) is Al. In this case, the additive contained in the electromigration reducing area 22 is preferably at least either one of at least one type selected from the group comprising Si, Cu, Nd, Mg, Fr, Ti, Mo, Ta, Nb, W, Ni, and Co, and an alloy of at least one type selected from the group and Al.

The content of the additive in the electromigration reducing area 22 is not limited. For example, from the viewpoint of the reduction of the electromigration, the content of the additive in the electromigration reducing area 22 is preferably 0.1% or greater by mass and 20.0% or lower by mass, more preferably 0.1% or greater by mass and 10.0% or lower by mass, and particularly preferably 0.1% or greater by mass and 5.0% or lower by mass.

In the semiconductor device 10A of the present embodiment, the electromigration reducing area 22 is provided in at least a portion of a perimeter of the bonding surface 24 of the wiring member 18 bonded to the electrode 16.

Figure 3A:
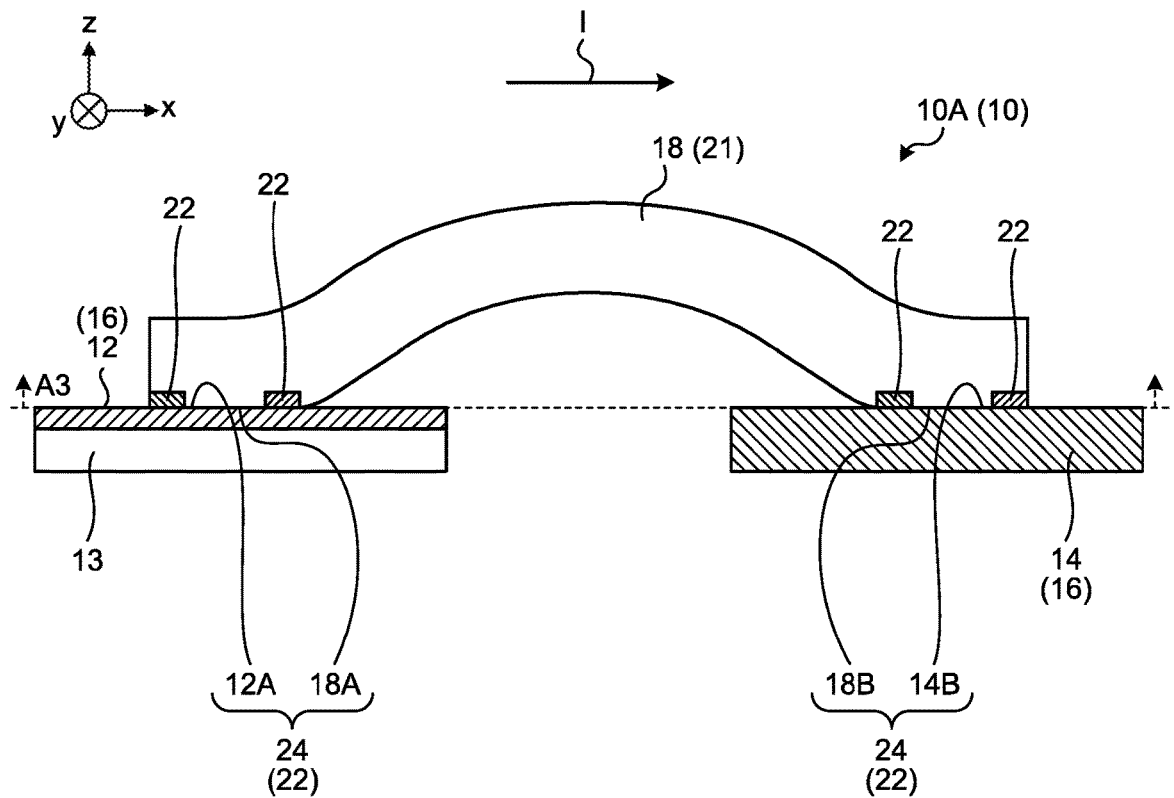
FIG. 3A is a schematic view of a section of the semiconductor device according to the first embodiment.
Figure 3B:
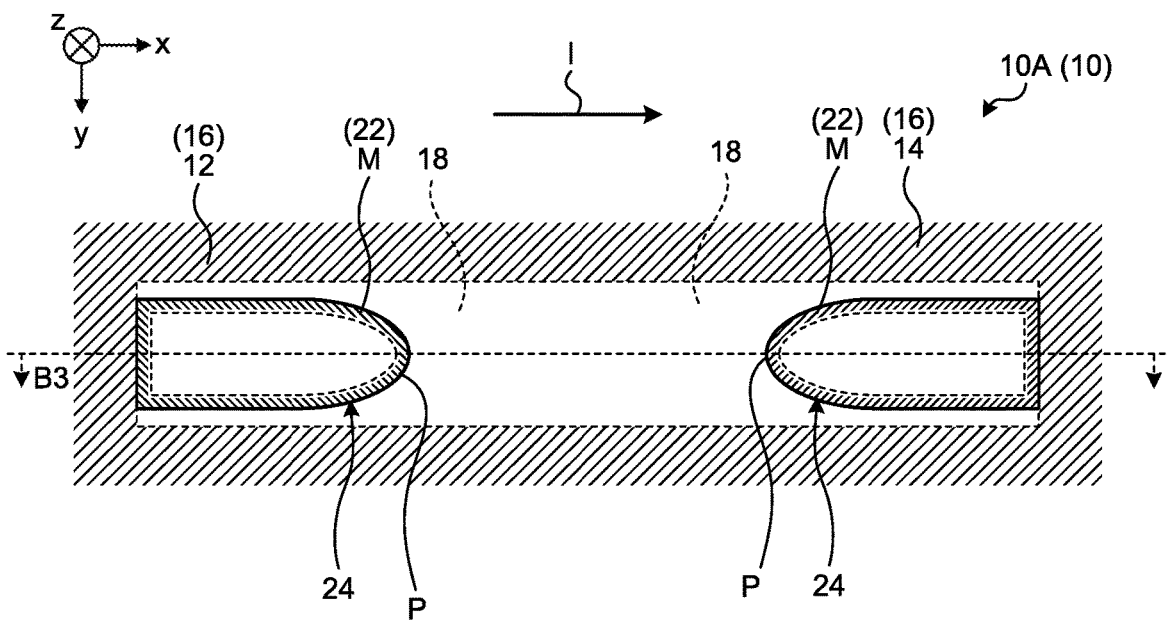
FIG. 3B is a schematic view of perimeters of bonding surfaces according to the first embodiment.

FIG. 3A is a sectional view of the semiconductor device 10A obtained by viewing a dotted line B3 portion of FIG. 3B in a positive y-axis direction. The positive y-axis direction refers to a direction from a start point toward an end point of an arrow indicating the y-axis direction in FIG. 3B. Of symbols representing xyz axes illustrated in the drawings used herein, a mark represented by "x" in "O" represents an arrow in a direction from a start point on the front side of the drawing toward an end point on the back side of the drawing. Of the symbols representing the xyz axes illustrated in the drawings used herein, a mark represented by "•" (small filled circle) in "O" represents an arrow in a direction from the start point on the back side of the drawing toward the end point on the front side of the drawing.

As illustrated in FIG. 3A, for example, the semiconductor device 10A includes the first electrode 12 serving as the above-mentioned surface electrode (semiconductor electrode) on a portion of an end face of a semiconductor 13. In the present embodiment, a case will be described as an example where the second electrode 14 of the semiconductor device 10A is the above-mentioned substrate electrode.

In the semiconductor device 10A, the bonding surface 24 of the wiring member 18 and the first electrode 12 includes a bonding surface 12A and a bonding surface 18A. The bonding surface 12A is the bonding surface 24 of the first electrode 12 bonded to the wiring member 18. The bonding surface 18A is the bonding surface 24 of the wiring member 18 bonded to the first electrode 12.

The bonding surface 24 of the wiring member 18 and the second electrode 14 includes a bonding surface 14B and a bonding surface 18B. The bonding surface 14B is the bonding surface 24 of the second electrode 14 bonded to the wiring member 18. The bonding surface 18B is the bonding surface 24 of the wiring member 18 bonded to the second electrode 14.

The present embodiment will be described by way of an example of a configuration in which at least a portion of the perimeter of each of the bonding surface 18A and the bonding surface 18B serving as the bonding surface 24 on the wiring member 18 side includes the electromigration reducing area 22. As an example, FIG. 3A illustrates a configuration in which the electromigration reducing area 22 is provided over the whole area of the perimeter of the bonding surface 24 of the wiring member 18.

The perimeter of the bonding surface 24 refers to an area along the outer circumference of the bonding surface 24.

FIG. 3B is a sectional view of the semiconductor device 10A obtained by viewing a dotted line A3 portion of FIG. 3A in a positive z-axis direction, and is an explanatory view of a perimeter M of the bonding surface 24. The positive z-axis direction refers to a direction from a start point toward an end point of an arrow indicating the z-axis direction in FIG. 3A. The perimeter M of the bonding surface 24 refers to an area along an outer circumference P of the bonding surface 24. In detail, the perimeter M of the bonding surface 24 is a belt-like area having a predetermined width extending toward the inside of the bonding surface 24 from the outer circumference P of the bonding surface 24. The perimeter M of the bonding surface 24 only needs to be an area along the outer circumference P of the bonding surface 24, and may include an area having a predetermined width toward the outside of the bonding surface 24 from the outer circumference P of the bonding surface 24 in addition to the belt-like area having the predetermined width extending toward the inside of the bonding surface 24.

The predetermined width of the perimeter M only needs to be adjusted as appropriate according to, for example, a current intensity applied to the wiring member 18 and a constituent material of the base material of the perimeter M. For example, the predetermined width of the perimeter M is preferably 0.1 μm or greater and 50 μm or smaller, and is, for example, 0.1 μm or greater and 5 μm or smaller, but is not limited to these ranges.

The electromigration reducing area 22 may be provided in a portion of the perimeter M of each of the bonding surface 18A and the bonding surface 18B.

Figure 4A:
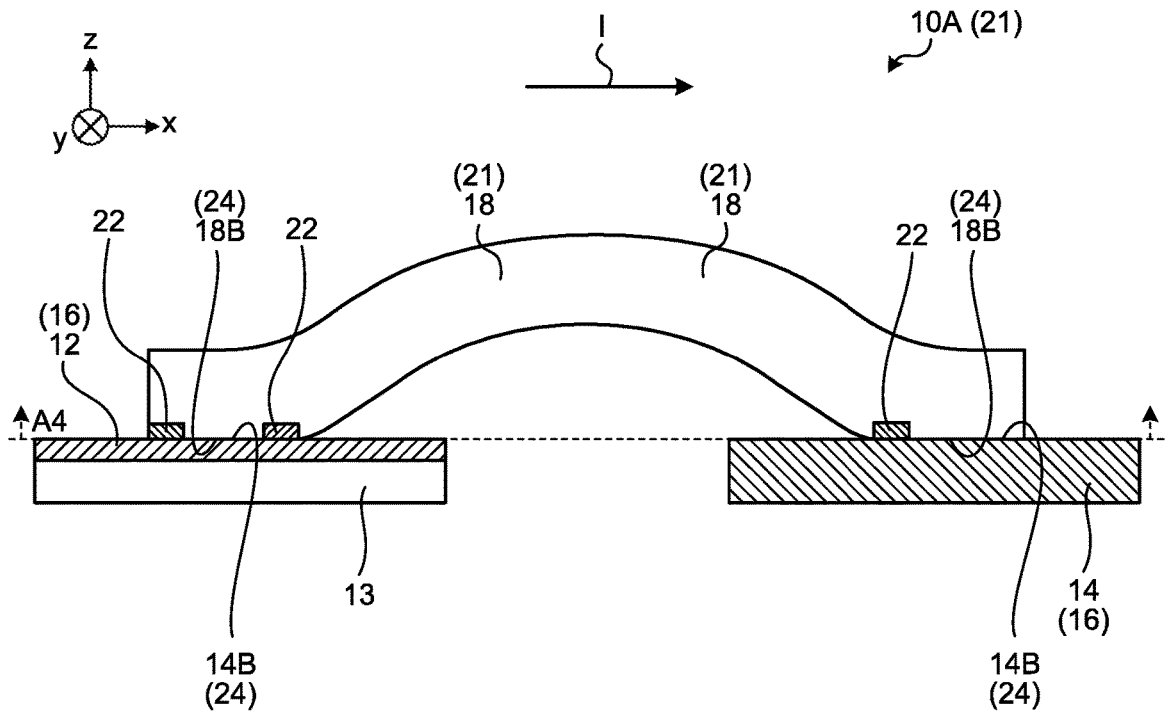
FIG. 4A is still another schematic view of the semiconductor device according to the first embodiment.
Figure 4B:
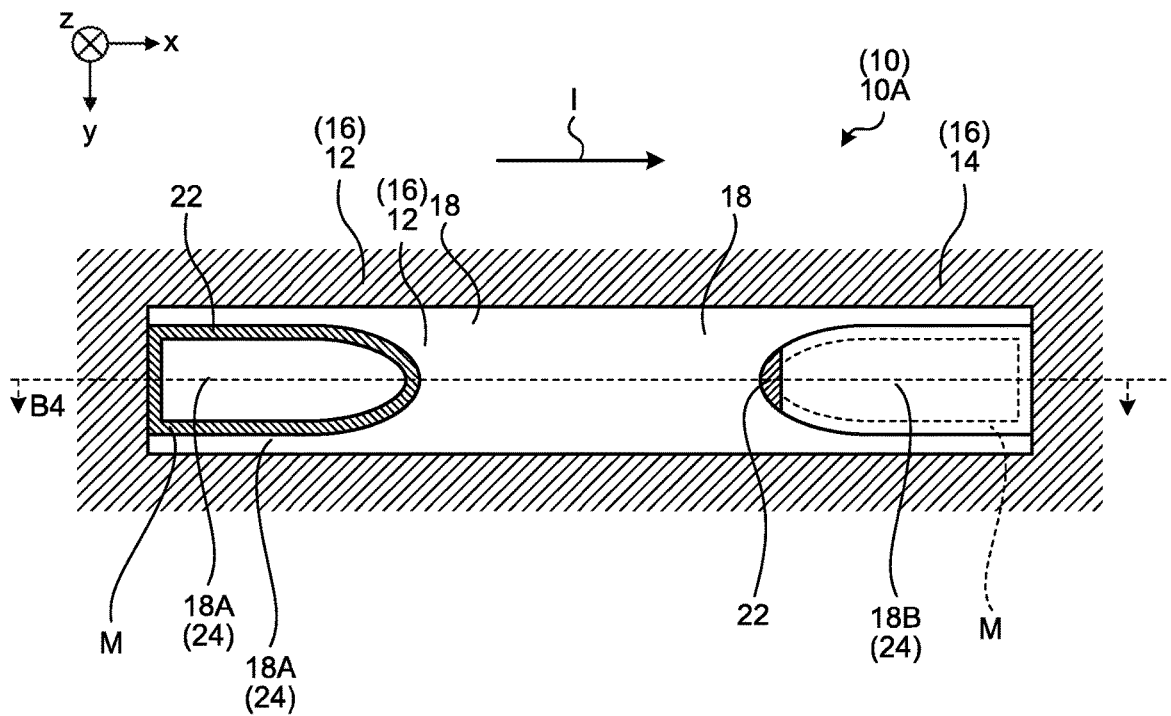
FIG. 4B is still another schematic view of the semiconductor device according to the first embodiment.

FIG. 4A is a sectional view of the semiconductor device 10A obtained by viewing a dotted line B4 portion of FIG. 4B in the positive y-axis direction. FIG. 4B is a sectional view of the semiconductor device 10A obtained by viewing a dotted line A4 portion of FIG. 4A in the positive z-axis direction.

In the semiconductor device 10A of the present embodiment, the electromigration reducing area 22 with the above-described additive added thereto is provided in the perimeter M of the bonding surface 18A of the wiring member 18. The electromigration reducing area 22 with the above-described additive added thereto is also provided in an end area of the perimeter M of the bonding surface 18B of the wiring member 18, the end area being located on an upstream side in the current direction I of the wiring member 18. The electromigration reducing area 22 may be provided in a portion of the perimeter M of the bonding surface 18A.

As described above, in the semiconductor device 10A of the present embodiment, the first electrode 12 serving as the semiconductor electrode is provided on the semiconductor 13, while the second electrode 14 is the substrate electrode.

The inventors of the present invention have found that a current density is more concentrated on the whole perimeter M of the bonding surface 24 as the thickness of the first electrode 12 serving as the surface electrode (semiconductor electrode) is smaller (for example, in the case of a metal foil of 10 μm or thinner). In detail, the inventors have found that a current that has flowed from the semiconductor 13 having a larger resistance into the first electrode 12 having a lower resistance and a smaller thickness than the semiconductor 13 is concentrated on the bonding surface 24, and as a result, the current density is concentrated on the whole perimeter M of the bonding surface 24.

The inventors have also found that the current density is more concentrated on an inside area of the bonding surface 24 when the second electrode 14 serving as the substrate electrode (for example, a metal plate of 10 μm or thicker) is used. In detail, the inventors have found that the current density is more concentrated on the inside area of the bonding surface 24 as the thickness of the substrate electrode is larger. The inside area refers to an area of the bonding surface 24 on a side facing the other bonding surface 24.

Hence, the electromigration reducing area 22 is preferably provided in the whole area of the perimeter M of the bonding surface 18A constituting the bonding surface 24 bonded to the first electrode 12 serving as the semiconductor electrode among the bonding surfaces 24 of the wiring member 18.

The electromigration reducing area 22 is also preferably provided at least in an area on the first electrode 12 side of the perimeter M of the bonding surface 18B constituting the bonding surface 24 bonded to the second electrode 14 serving as the substrate electrode among the bonding surfaces 24 of the wiring member 18.

The length in the current direction I of the electromigration reducing area 22 on the bonding surface 18B only needs to be adjusted as appropriate according to, for example, the current intensity applied to the wiring member 18 and the constituent material of the base material of the bonding surface 18B. For example, the length in the current direction I of the electromigration reducing area 22 on the bonding surface 18B is preferably in a range of 0.1 μm to 50 μm and more preferably in a range of 0.1 μm to 5 μm from the end on the upstream side in the current direction I of the bonding surface 18B.

The thickness of the electromigration reducing area 22 on each of the bonding surface 18A and the bonding surface 18B of the wiring member 18 is not limited. The thickness of the electromigration reducing area 22 refers to a length in a direction orthogonal to the current direction I (in an arrow Z direction in FIG. 4A, which hereinafter, may be called a thickness direction Z) of the wiring member 18. The thickness direction Z matches a stacking direction of the electrode 16 and the wiring member 18.

The thickness of the electromigration reducing area 22 is preferably in a range of 0.1 μm to 50 μm, and is, for example, in a range of 0.1 μm to 5 μm. The thickness of the electromigration reducing area 22 only needs to be adjusted as appropriate according to, for example, the current intensity applied to the wiring member 18, the material of the base material of the electromigration reducing area 22, the type of the additive contained in the electromigration reducing area 22, and the content of the additive.

The following describes an operation of the semiconductor device 10A of the present embodiment.

In the semiconductor device 10A of the present embodiment, a current flowing through the wiring member 18 is considered to cause the following phenomenon. The following description assumes a configuration in which the current flows in the current direction I, with the first electrode 12 side serving as the anode and the second electrode 14 side serving as the cathode.

First, the description assumes a comparative semiconductor device having a configuration not provided with the electromigration reducing area 22. The comparative semiconductor device has the same configuration as that of the semiconductor device 10, except in not being provided with the electromigration reducing area 22.

The inventors have found that, when the current flows in the current direction I through the wiring member 18 of the comparative semiconductor device, peaks of the current density, a vacancy concentration, and a hydrostatic stress appear in the perimeter M of the bonding surface 24 (the bonding surface 12A and the bonding surface 18A) of the first electrode 12 serving as the anode and the wiring member 18. This is considered to be because, as described above, the current that has flowed from the semiconductor 13 into the first electrode 12 having the lower resistance and the smaller thickness is concentrated on the bonding surface 24, and as a result, the current density is concentrated on the whole perimeter M of the bonding surface 24.

The inventors have also found that, when the electromigration reducing area 22 is not provided, the peaks of the current density, the vacancy concentration, and the hydrostatic stress also appear in the end area on the upstream side in the current direction I of the perimeter M of the bonding surface 24 (the bonding surface 14B and the bonding surface 18B) of the second electrode 14 serving as the cathode and the wiring member 18. This is considered to be because, as described above, the current density is more concentrated on the inside area of the bonding surface 24 when the substrate electrode (for example, the metal plate of 10 μm or thicker) is used as the second electrode 14 serving as the cathode.

In the semiconductor device 10A of the present embodiment, at least a portion of the perimeter M on each of the bonding surface 18A and the bonding surface 18B of the wiring member 18 serves as the electromigration reducing area 22 formed by adding the additive.

The metal atoms move faster at a place having a higher current density. For this reason, the additive contained in the electromigration reducing area 22 is considered to restrain at least one of the concentration of the current density, a thermal stress, increase and decrease of the vacancy concentration, and increase and decrease of the hydrostatic stress on each of the bonding surface 18A and the bonding surface 18B of the wiring member 18.

Thus, the semiconductor device 10 of the present embodiment can reduce the occurrence of the electromigration.

As described above, the semiconductor device 10A of the present embodiment includes the pair of electrodes 16 and the wiring member 18 electrically bonded to the pair of electrodes 16. In the semiconductor device 10 of the present embodiment, at least a portion of the perimeter M of the bonding surface 24 of at least one of the pair of electrodes 16 and the wiring member 18 includes the electromigration reducing area 22.

With this configuration, the semiconductor device 10A of the present embodiment can restrain at least one of the concentration of the current density, the thermal stress, the increase and decrease of the vacancy concentration, and the increase and decrease of the hydrostatic stress in the perimeter M of the bonding surface 24.

Accordingly, the semiconductor device 10A of the present embodiment can reduce the occurrence of the electromigration.

In the semiconductor device 10A of the present embodiment, the electromigration reducing area 22 is provided in the area of at least a portion of the perimeter M of the bonding surface 24. With this configuration, the semiconductor device 10A of the present embodiment can reduce the stress and strain caused by the electromigration.

As a result, the semiconductor device 10A of the present embodiment can reduce the occurrence of the electromigration, and can reduce mechanical deterioration.

In the semiconductor device 10A of the present embodiment, the electromigration reducing area 22 is the additive containing area formed by adding the additive to the base material of the perimeter M of the bonding surface 24.

The electromigration is reduced by adding the additive into the conductor. Adding the additive may, however, reduce the electrical conductivity or reduce the mechanical strength. Since the reduction of the electrical conductivity and the mechanical strength of the electrode 16 and the wiring member 18 directly leads to an increase in power loss and a reduction in mechanical life, the content and the containing portion of the additive are considered to be desirably as small as possible.

In the semiconductor device 10A of the present embodiment, the electromigration reducing area 22 is an area formed by adding the additive to a particular area, such as the area of at least a portion of the perimeter M of the bonding surface 24.

With this configuration, the semiconductor device 10A of the present embodiment can restrain the electrical resistivity and the mechanical strength of the electrode 16 and the wiring member 18 from being reduced by the addition of the additive, and can reduce the electromigration.

The additive may be added to at least a portion of the bonding surface 24 of the wiring member 18 in advance before the bonding, or during the bonding, or after the bonding. The additive may be added a plurality of times, or may be separately added to a plurality of areas.

The semiconductor device 10A only needs to have a configuration in which at least a portion of the perimeter M of at least one of the bonding surface 18A and the bonding surface 18B of the wiring member 18 includes the electromigration reducing area 22. Therefore, the electromigration reducing area 22 may be included in at least a portion of the perimeter M of only one of the bonding surface 18A and the bonding surface 18B.

Modification 1

In the above-described embodiment, as illustrated in FIG. 3A, the configuration has been described as an example in which the portion of the end face of the semiconductor 13 includes the first electrode 12 serving as the above-mentioned surface electrode (semiconductor electrode). In the above-described embodiment, the case has also been described as an example where the second electrode 14 of the semiconductor device 10 is the substrate electrode. The semiconductor device 10 may, however, include both the first electrode 12 and the second electrode 14 as the substrate electrodes.

Figure 5:
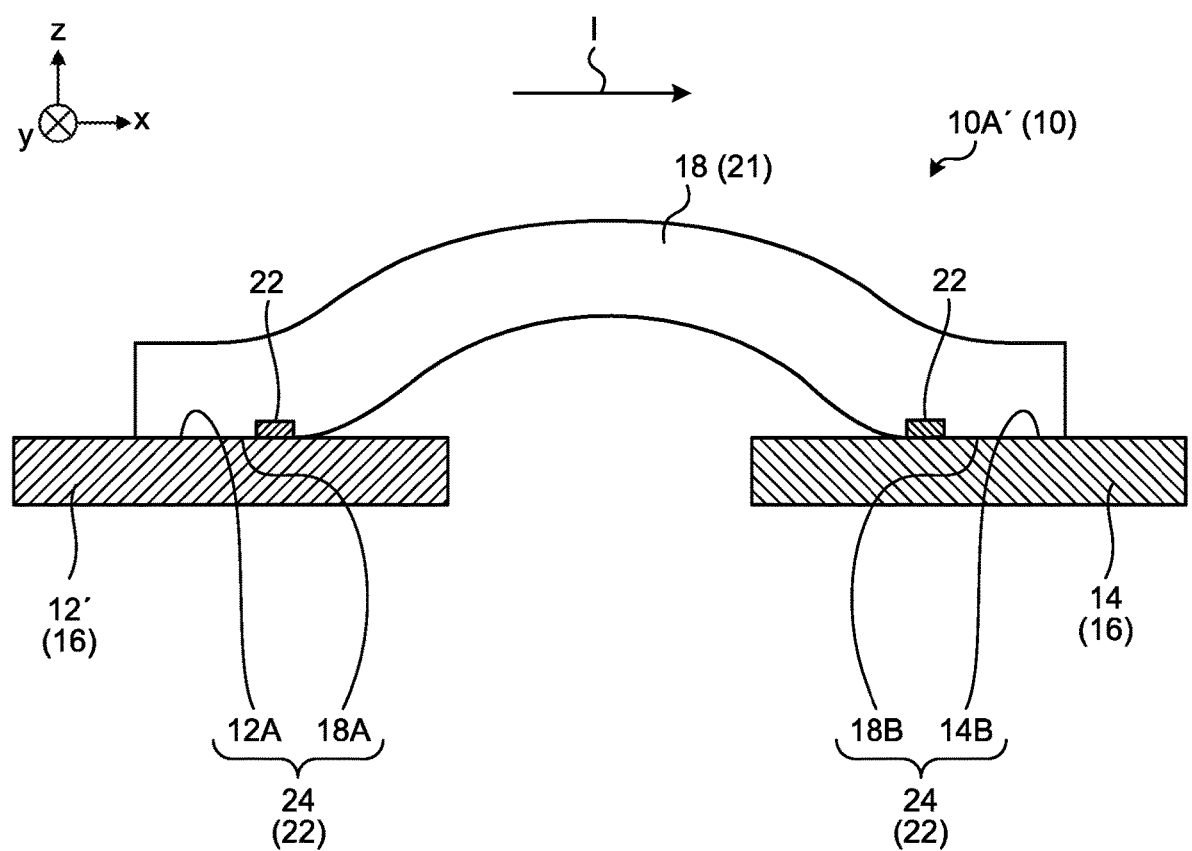
FIG. 5 is a schematic view of a section of a semiconductor device according to a modification.

FIG. 5 is a sectional view of a semiconductor device 10A' of Modification 1, and illustrates a section in the same position and direction as those in FIG. 3A.

The semiconductor device 10A' has the same configuration as that of the semiconductor device 10A of the above-described embodiment, except in including a first electrode 12' instead of the first electrode 12. The first electrode 12' is the substrate electrode.

As described above, the inventors have found that the current density is more concentrated on the inside area of the bonding surface 24 when the substrate electrode (of, for example, 10 μm or thicker) is used.

Therefore, when the first electrode 12 and the second electrode 14 are configured as the above-described substrate electrodes, the electromigration reducing area 22 is preferably provided in at least the inside area of the perimeter M of each of both the bonding surface 18A and the bonding surface 18B.

Modification 2

In the above-described embodiment, the case has been described as an example where two of the bonding surfaces 24 are present for the wiring member 18 and the electrodes 16. However, a plurality of the bonding surfaces 24 may be present for the wiring member 18 and the electrodes 16.

Each of FIGS. 6A to 6C is a sectional view of an example in the case where a plurality of the bonding surfaces 24 are present for the wiring member 18 and the electrodes 16, and illustrates a section in the same position and direction as those in FIG. 3B.

FIG. 6A illustrates, as an example, a case where the semiconductor device 10A has four of the bonding surfaces 24 (bonding surfaces 24A to 24D) from the upstream side toward the downstream side in the current direction I. FIG. 6A also illustrates, as an example, a case where the electrode 16 including the bonding surface 24A on the most upstream side in the current direction I serves as a semiconductor electrode 16A. FIG. 6A further illustrates, as an example, a case where the electrode 16 including the bonding surfaces 24 (bonding surfaces 24B to 24D) other than the bonding surface 24A on the most upstream side in the current direction I serves as a substrate electrode 16B.

As described above, the inventors have found that the current density is more concentrated on the whole perimeter M of the bonding surface 24 as the thickness of the semiconductor electrode is smaller (for example, 10 μm or smaller). The inventors have also found that the current density is more concentrated on the inside area of the bonding surface 24 when the substrate electrode (of, for example, 10 μm or thicker) is used.

Therefore, in the case of the configuration illustrated in FIG. 6A, the electromigration reducing area 22 is preferably provided in the whole area of the perimeter M of the bonding surface 24A bonded to the semiconductor electrode 16A disposed on the most upstream side in the current direction I.

The electromigration reducing area 22 is also preferably provided at least in each of the inside areas serving as areas facing the other bonding surfaces 24 in the perimeters M of the bonding surfaces 24 (bonding surfaces 24B to 24D) other than the bonding surface 24A on the most upstream side in the current direction I.

FIG. 6B illustrates, as an example, the case where the semiconductor device 10A has the four bonding surfaces 24 (bonding surfaces 24A to 24D) from the upstream side toward the downstream side in the current direction I. FIG. 6B also illustrates, as an example, a case where the electrode 16 including the bonding surface 24B adjacent on the downstream side to the bonding surface 24A on the most upstream side in the current direction I serves as the semiconductor electrode 16A. FIG. 6B further illustrates, as an example, a case where the electrode 16 including the bonding surfaces 24 (bonding surfaces 24A, 24C, and 24D) other than the bonding surface 24B serves as the substrate electrode 16B.

In the case of the configuration illustrated in FIG. 6B, the electromigration reducing area 22 is preferably provided in the whole area of the perimeter M of the bonding surface 24B bonded to the semiconductor electrode 16A.

The electromigration reducing area 22 is also preferably provided at least in each of the inside areas serving as areas facing the other bonding surfaces 24 in the perimeters M of the bonding surfaces 24 (bonding surfaces 24A, 24C, and 24D) bonded to the substrate electrode 16B.

FIG. 6C illustrates, as an example, the case where the semiconductor device 10A has the four bonding surfaces 24 (bonding surfaces 24A to 24D) from the upstream side toward the downstream side in the current direction I. FIG. 6C also illustrates, as an example, a case where the electrode 16 including all the bonding surfaces 24 (bonding surfaces 24A to 24B) serves as the substrate electrode 16B.

In the case of the configuration illustrated in FIG. 6C, the electromigration reducing area 22 is preferably provided at least in each of the inside areas serving as areas facing the other bonding surfaces 24 in the perimeters M of all the bonding surfaces 24A to 24D serving as the bonding surfaces 24 bonded to the substrate electrode 16B.

Second Embodiment

In a second embodiment, a configuration will be described in which the electromigration reducing area 22 is provided on the electrode 16 side. In the same way as in the first embodiment, the electromigration reducing area 22 is the additive containing area containing the above-described additive.

Figure 7A:
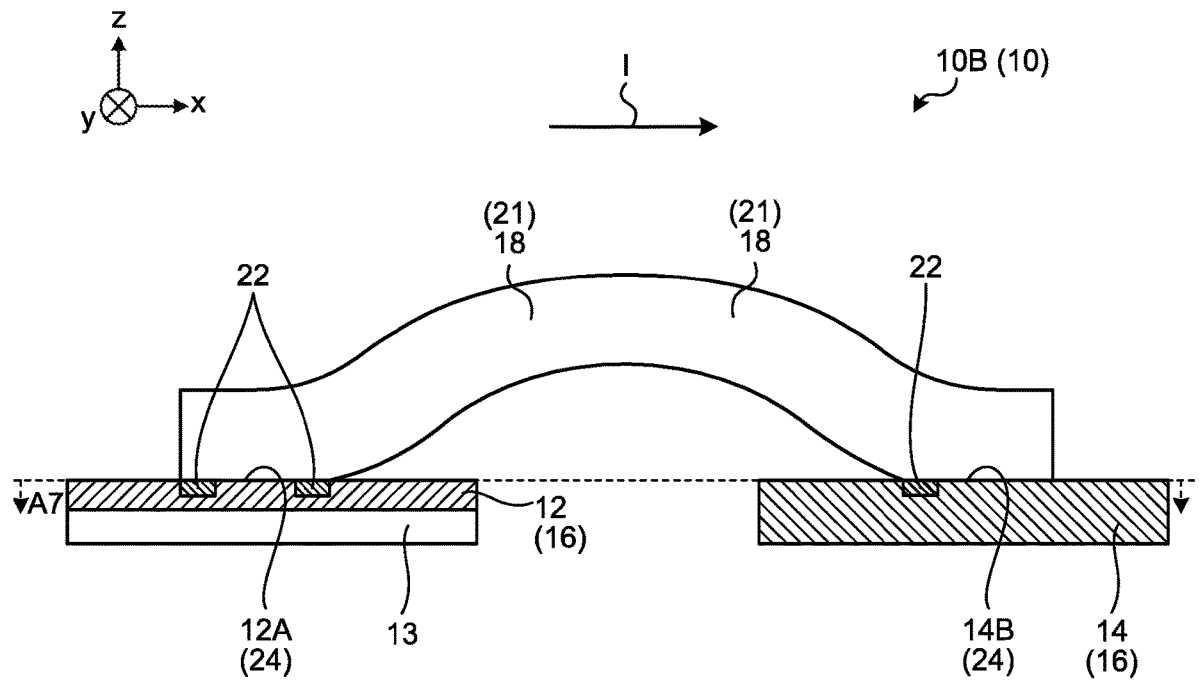
FIG. 7A is a schematic view of a semiconductor device according to a second embodiment.
Figure 7B:
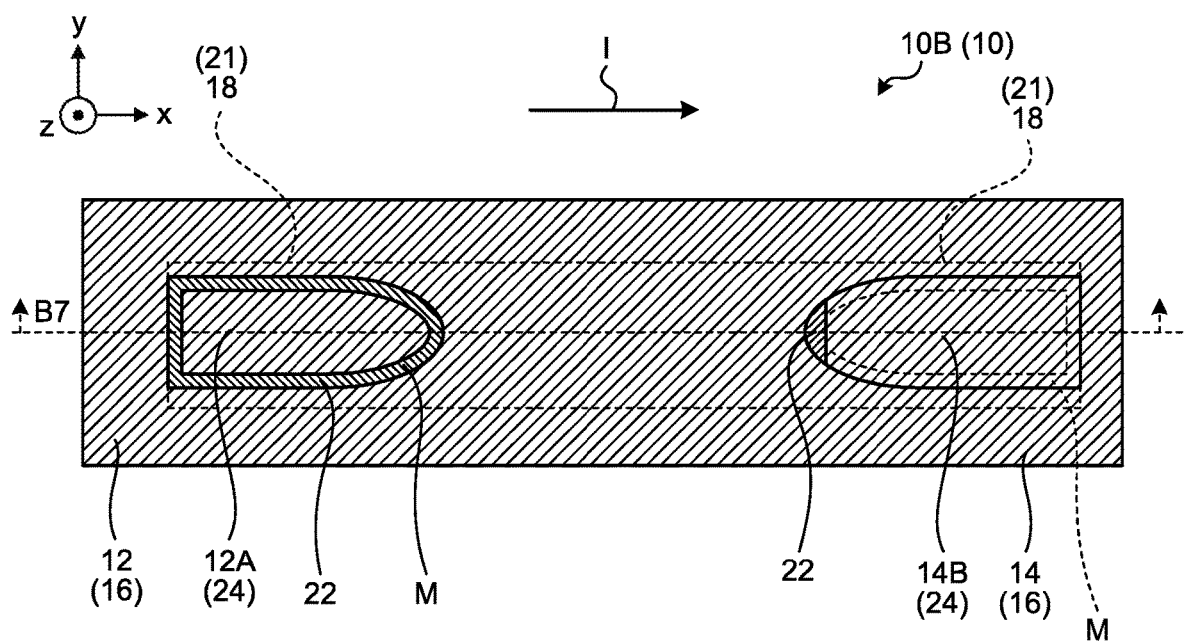
FIG. 7B is another schematic view of the semiconductor device according to the second embodiment.

FIG. 7A is a sectional view of a semiconductor device 10B obtained by viewing a dotted line B7 portion of FIG. 7B in the positive y-axis direction. FIG. 7B is a sectional view of the semiconductor device 10B obtained by viewing a dotted line A7 portion of FIG. 7A in a negative z-axis direction. The negative z-axis direction refers to a direction from the end point toward the start point of the arrow indicating the z-axis direction in FIG. 7A. The semiconductor device 10B is an example of the semiconductor device 10. Parts having the same configuration as those of the first embodiment will be denoted by the same reference numerals, and will not be described in detail.

FIG. 7A is a sectional view of the semiconductor device 10B. FIG. 7B is a plan view of the semiconductor device 10B.

The semiconductor device 10B includes the pair of electrodes 16 (the first electrode 12 and the second electrode 14), and the wiring member 18. In the same way as in the above-described embodiment, the semiconductor device 10B includes the first electrode 12 serving as the above-mentioned surface electrode (semiconductor electrode) on the portion of the end face of the semiconductor 13. In the present embodiment, a case will be described as an example where the second electrode 14 of the semiconductor device 10B is the above-mentioned substrate electrode. The semiconductor device 10B has the same configuration as that of the semiconductor device 10 of the first embodiment, except that the electromigration reducing area 22 is provided in a different position.

In the semiconductor device 10B of the present embodiment, the electromigration reducing area 22 with the above-described additive added thereto is provided in each of the bonding surfaces 24 (the bonding surface 12A and the bonding surface 14B) of the electrodes 16 (the first electrode 12 and the second electrode 14). In detail, in the semiconductor device 10B, the electromigration reducing area 22 with the above-described additive added thereto is provided in the perimeter M of the bonding surface 12A of the first electrode 12. In the semiconductor device 10B, the electromigration reducing area 22 with the above-described additive added thereto is also provided in an end area of the perimeter M of the bonding surface 14B, the end area being located on the upstream side in the current direction I of the wiring member 18.

The electromigration reducing area 22 may be provided in the whole area of the perimeter M of each of both the bonding surface 12A and the bonding surface 14B. The electromigration reducing area 22 may be provided in a portion of the perimeter M of the bonding surface 12A.

As described in the first embodiment, the inventors have found that the current density is more concentrated on the whole perimeter M of the bonding surface 24 as the thickness of the first electrode 12 serving as the surface electrode (semiconductor electrode) is smaller. The inventors have also found that the current density is more concentrated on the inside area of the bonding surface 24 when the substrate electrode is used.

Therefore, the electromigration reducing area 22 is preferably provided in the whole area of the perimeter M of the bonding surface 12A constituting the bonding surface 24 bonded to the first electrode 12 serving as the thin semiconductor electrode among the bonding surfaces 24 of the wiring member 18.

The electromigration reducing area 22 is also preferably provided in at least an area on the first electrode 12 side of the perimeter M of the bonding surface 14B constituting the bonding surface 24 bonded to the second electrode 14 serving as the substrate electrode among the bonding surfaces 24 of the wiring member 18.

The length in the current direction I of the electromigration reducing area 22 on the bonding surface 14B only needs to be adjusted as appropriate according to, for example, the current intensity applied to the wiring member 18 and the constituent material of the base material of the bonding surface 14B. For example, the length in the current direction I of the electromigration reducing area 22 on the bonding surface 14B is preferably in a range of 0.1 µm to 50 µm and more preferably in a range of 0.1 µm to 5 µm from the end on the upstream side in the current direction I of the bonding surface 14B.

The thickness of the electromigration reducing area 22 on each of the bonding surface 12A and the bonding surface 14B of the electrode 16 is not limited. The thickness of the electromigration reducing area 22 on the electrode 16 only needs to be the same as that in the first embodiment.

The following describes an operation of the semiconductor device 10B of the present embodiment.

In the semiconductor device 10B of the present embodiment, a current flowing through the wiring member 18 is considered to cause the following phenomenon. The following description assumes the configuration in which the current flows in the current direction I, with the first electrode 12 side serving as the anode and the second electrode 14 side serving as the cathode.

As described in the first embodiment, when the current flows in the current direction I through the wiring member 18 of the comparative semiconductor device not provided with the electromigration reducing area 22, the peaks of the current density, the vacancy concentration, and the hydrostatic stress appear in the perimeter M of the bonding surface 24 (the bonding surface 12A and the bonding surface 18A) of the first electrode 12 serving as the anode and the wiring member 18. When the electromigration reducing area 22 is not provided, the peaks of the current density, the vacancy concentration, and the hydrostatic stress also appear in the end area on the upstream side in the current direction I of the perimeter M of the bonding surface 24 (the bonding surface 14B and the bonding surface 18B) of the second electrode 14 serving as the cathode and the wiring member 18.

However, in the semiconductor device 10B of the present embodiment, the electromigration reducing area 22 formed by adding the additive is provided in an area of at least a portion of the perimeter M of each of the bonding surface 12A of the first electrode 12 and the bonding surface 14B of the second electrode 14.

Accordingly, the additive contained in the electromigration reducing area 22 is considered to restrain at least one of the concentration of the current density, the thermal stress, the increase and decrease of the vacancy concentration, and the increase and decrease of the hydrostatic stress on each of the bonding surface 12A of the first electrode 12 and the bonding surface 14B of the second electrode 14.

Accordingly, the semiconductor device 10B of the present embodiment can reduce the occurrence of the electromigration.

The semiconductor device 10B of the present embodiment may have a configuration of further including the electromigration reducing area 22 described in the above-described first embodiment in addition to the electromigration reducing area 22. That is, the semiconductor device 10B may have a configuration of having the electromigration reducing areas 22 in both the bonding surface 24 on the electrode 16 side and the bonding surface 24 on the wiring member 18 side.

In the present embodiment, the case has been described as an example where the first electrode 12 serves as the semiconductor electrode stacked on the semiconductor 13, and the second electrode 14 serves as the substrate electrode. However, in the same way as the semiconductor device 10A of the above-described embodiment, the semiconductor device 10B may include both the first electrode 12 and the second electrode 14 as the substrate electrodes (refer to FIG. 5).

In this case, in the same way as in the above-described first embodiment and the above-described modifications, the electromigration reducing area 22 is preferably provided at least in an area facing the other bonding surface 24 in a portion of the perimeter M on the bonding surface 24 of each of the first electrode 12 and the second electrode 14 serving as the substrate electrodes.

The additive may be added to at least a portion of the bonding surface 24 of the electrode 16 in advance before the bonding, or during the bonding, or after the bonding. The additive may be added a plurality of times, or may be separately added to a plurality of areas.

Third Embodiment

Figure 8:
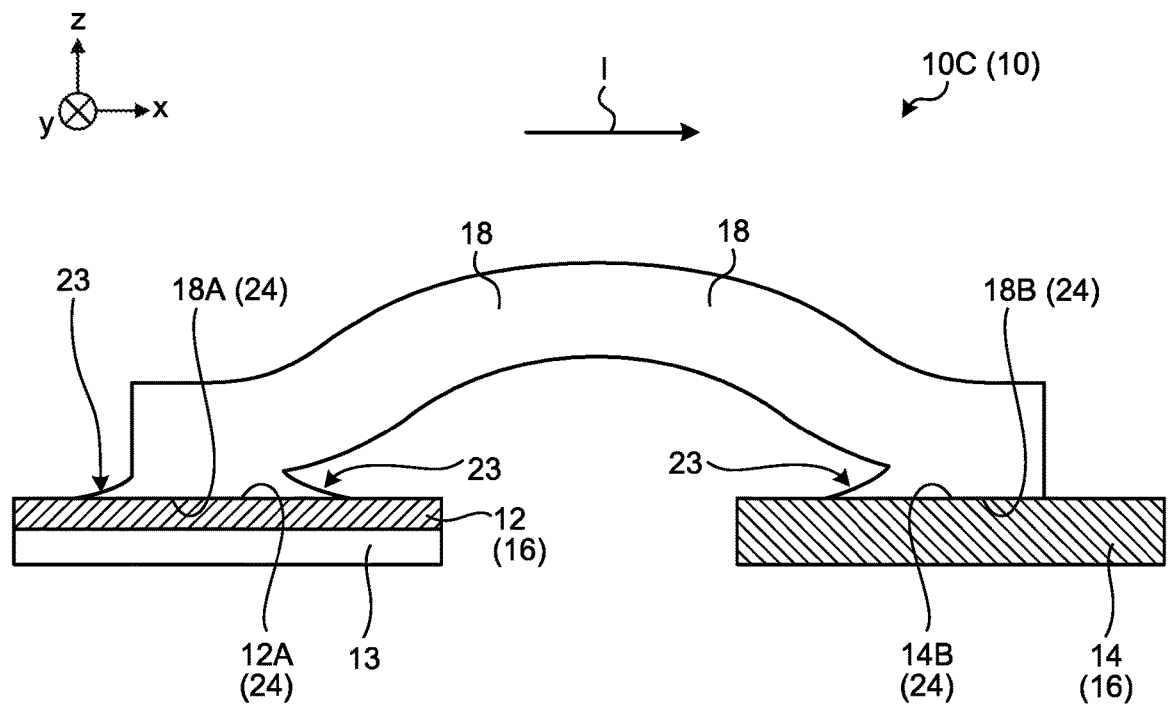
FIG. 8 is a schematic view of a semiconductor device according to a third embodiment.

FIG. 8 is a sectional view of a semiconductor device 10C according to a third embodiment, and illustrates a section in the same position and direction as those in FIG. 3B. In the present embodiment, a configuration will be described in which the bonding surface 24 of the wiring member 18 has a specific shape, and an area having the specific shape serves as an electromigration reducing area 23. Parts having the same configuration as those of the first embodiment will be denoted by the same reference numerals, and will not be described in detail.

The semiconductor device 10C includes the pair of electrodes 16 (the first electrode 12 and the second electrode 14), and the wiring member 18. In the same way as in the above-described embodiments, the semiconductor device 10C includes the first electrode 12 serving as the above-mentioned surface electrode (semiconductor electrode) on the portion of the end face of the semiconductor 13. The second electrode 14 is the substrate electrode. The semiconductor device 10C has the same configuration as that of the semiconductor device 10A of the first embodiment, except in including the electromigration reducing area 23 instead of the electromigration reducing area 22.

The electromigration reducing area 23 is an area in which a sectional shape of at least a portion of the perimeter M of at least one of the bonding surface 18A and the bonding surface 18B of the wiring member 18 is a fillet shape. The electromigration reducing area 23 serving as a fillet-shaped area is specifically an area having a circular arc sectional shape. The fillet shape may be called a shape broader downward. The sectional shape refers to a shape of a section obtained by cutting the wiring member 18 in the thickness direction Z. The definition of the thickness direction Z is the same as that in the above-described embodiments.

In the semiconductor device 10C of the present embodiment, the perimeter M of the bonding surface 18A of the wiring member 18 serves as the electromigration reducing area 23 that is the fillet-shaped area. The end area of the perimeter M of the bonding surface 18B of the wiring member 18 located on the upstream side in the current direction I of the wiring member 18 also serves as the electromigration reducing area 23 that is the fillet-shaped area.

The whole circumference of the perimeter M of each of both the bonding surface 18A and the bonding surface 18B may have the fillet shape such that the whole area of the perimeter M serves as the electromigration reducing area 23. Alternatively, a portion of the perimeter M of the bonding surface 18A may have the fillet shape such that the area having the fillet shape serves as the electromigration reducing area 23.

As described above, the semiconductor device 10C of the present embodiment includes the first electrode 12 serving as the above-mentioned surface electrode (semiconductor electrode) on the portion of the end face of the semiconductor 13 while the second electrode 14 is the substrate electrode.

Hence, the whole circumference of the perimeter M of the bonding surface 18A constituting the bonding surface 24 bonded to the first electrode 12 among the bonding surfaces 24 of the wiring member 18 preferably has the fillet shape. At least a portion on the first electrode 12 side of the perimeter M of the bonding surface 18B constituting the bonding surface 24 bonded to the second electrode 14 also preferably has the fillet shape.

The fillet shape may be formed when the wiring member 18 is ultrasonically bonded to the electrode 16. Alternatively, each of the bonding surface 18A and the bonding surface 18B of the wiring member 18 may be formed in advance into the fillet shape, and then, bonded to the electrode 16. Further alternatively, a convex portion to constitute the fillet-shaped electromigration reducing area 23 may be formed in advance on the bonding surface 24 on the electrode 16 side, and then, each of the bonding surface 18A and the bonding surface 18B of the wiring member 18 may be bonded to the convex portion to form the electromigration reducing area 23.

The following describes an operation of the semiconductor device 10C of the present embodiment.

In the semiconductor device 10C of the present embodiment, a current flowing through the wiring member 18 is considered to cause the following phenomenon. The following description assumes the configuration in which the current flows in the current direction I, with the first electrode 12 side serving as the anode and the second electrode 14 side serving as the cathode.

As described in the first embodiment, when the current flows in the current direction I through the wiring member 18 of the comparative semiconductor device provided with neither the electromigration reducing area 22 nor the electromigration reducing area 23, the peaks of the current density, the vacancy concentration, and the hydrostatic stress appear in the perimeter M of the bonding surface 24 (the bonding surface 12A and the bonding surface 18A) of the first electrode 12 serving as the anode and the wiring member 18. When neither the electromigration reducing area 22 nor the electromigration reducing area 23 is provided, the peaks of the current density, the vacancy concentration, and the hydrostatic stress also appear in the end area on the upstream side in the current direction I of the perimeter M of the bonding surface 24 (the bonding surface 14B and the bonding surface 18B) of the second electrode 14 serving as the cathode and the wiring member 18.

However, in the semiconductor device 10C of the present embodiment, at least a portion of each of the bonding surface 18A and the bonding surface 18B of the wiring member 18 serves as the electromigration reducing area 23 having the fillet shape.

Thus, having the fillet shape is considered to allow the electromigration reducing area 23 to restrain at least one of the concentration of the current density, the thermal stress, the increase and decrease of the vacancy concentration, and the increase and decrease of the hydrostatic stress on each of the bonding surface 18A and the bonding surface 18B of the wiring member 18.

Accordingly, the semiconductor device 10C of the present embodiment can reduce the occurrence of the electromigration.

The semiconductor device 10C of the present embodiment may have a configuration of further including the electromigration reducing area 22 described in the above-described embodiments in addition to the electromigration reducing area 23.

In the present embodiment, the configuration has been described in which the first electrode 12 serving as the above-mentioned surface electrode (semiconductor electrode) is included in the portion of the end face of the semiconductor 13. In the present embodiment, the case has been described as an example where the second electrode 14 is the substrate electrode.

However, in the same way as the semiconductor device 10A' of the above-described embodiment, the semiconductor device 10C may include both the first electrode 12 and the second electrode 14 as the substrate electrodes (refer to FIG. 5).

In this case, in the same way as in the above-described first embodiment, on both the bonding surface 18A and the bonding surface 18B respectively constituting the first electrode 12 and the second electrode 14 serving as the substrate electrodes, at least areas of the perimeters M facing the other bonding surfaces 24 preferably have the fillet shape.

Fourth Embodiment

Figure 9:
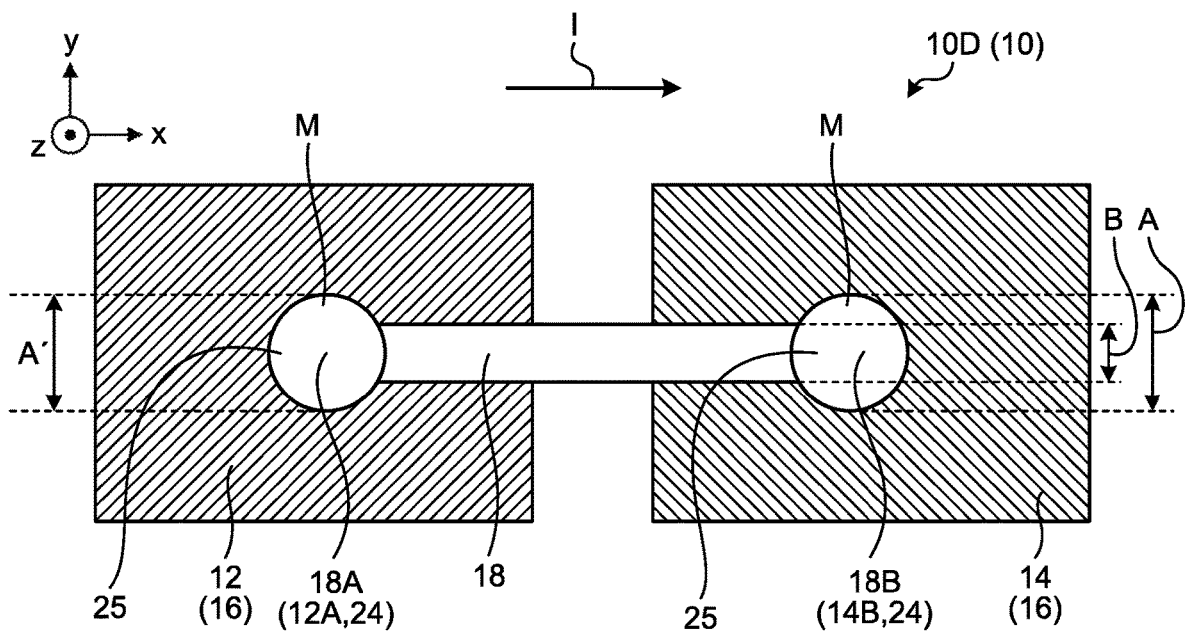
FIG. 9 is a schematic view of a semiconductor device according to a fourth embodiment.

FIG. 9 is a view of a semiconductor device 10D according to a fourth embodiment as viewed in the negative z-axis direction from a viewpoint distant in the positive z-axis direction. In the present embodiment, a configuration will be described in which both ends in the current direction I of the wiring member 18 have a specific size to each serve as an electromigration reducing area 25. Parts having the same configuration as those of the first embodiment will be denoted by the same reference numerals, and will not be described in detail.

The semiconductor device 10D includes the pair of electrodes 16 (the first electrode 12 and the second electrode 14), and the wiring member 18. In the same way as in the above-described embodiments, the semiconductor device 10D includes the first electrode 12 serving as the above-mentioned surface electrode (semiconductor electrode) on the portion of the end face of the semiconductor 13. FIG. 9 does not illustrate the semiconductor 13. The second electrode 14 is the substrate electrode. Both the first electrode 12 and the second electrode 14 may be the substrate electrodes in the same way as in the above-described embodiments. The semiconductor device 10D has the same configuration as that of the semiconductor device 10A of the first embodiment, except in including the electromigration reducing area 25 instead of the electromigration reducing area 22.

The electromigration reducing area 25 is an area including the perimeter M of at least one of the bonding surface 18A and the bonding surface 18B of the wiring member 18, and is an area larger than a sectional area of a body of the wiring member 18. The body of the wiring member 18 refers to a central portion in the current direction I of the wiring member 18. The sectional area refers to an area of an orthogonal section orthogonal to the current direction I of the current flowing through the wiring member 18.

Specifically, the sectional area of the bonding surface 18A of the wiring member 18 is, for example, a sectional area of a circular area having a diameter A' in FIG. 9. The sectional area of the bonding surface 18B of the wiring member 18 is, for example, a sectional area of a circular area having a diameter A in FIG. 9. The sectional area of the body of the wiring member 18 is, for example, a sectional area of a circular area having a diameter B in FIG. 9. The sectional shape of the bonding surface 18A, the bonding surface 18B, and the body of the wiring member 18 along the current direction I is not limited to the circular shape.

The sectional area of the electromigration reducing area 25 only needs to be larger than that of the body of the wiring member 18, and is preferably 1.1 to 5 times and more preferably 1.5 to 3 times that of the body of the wiring member 18.

The electromigration reducing area 25 may be formed when the wiring member 18 is ultrasonically bonded to the electrode 16. Alternatively, each of the bonding surface 18A and the bonding surface 18B of the wiring member 18 may be formed into a shape larger than the body of the wiring member 18, and then, bonded to the electrode 16. Further alternatively, a convex portion to constitute the electromigration reducing area 25 may be formed in advance on the bonding surface 24 on the electrode 16 side, and then, each of the bonding surface 18A and the bonding surface 18B of the wiring member 18 may be bonded to the convex portion to form the electromigration reducing area 25.

In the semiconductor device 10D of the present embodiment, a current flowing through the wiring member 18 is considered to cause the following phenomenon. The following description assumes the configuration in which the current flows in the current direction I, with the first electrode 12 side serving as the anode and the second electrode 14 side serving as the cathode.

As described in the first embodiment, when the current flows in the current direction I through the wiring member 18 of the comparative semiconductor device provided with none of the electromigration reducing area 22, the electromigration reducing area 23, and the electromigration reducing area 25, the peaks of the current density, the vacancy concentration, and the hydrostatic stress appear in the perimeter M of the bonding surface 24 (the bonding surface 12A and the bonding surface 18A) of the first electrode 12 serving as the anode and the wiring member 18. When none of the electromigration reducing area 22, the electromigration reducing area 23, and the electromigration reducing area 25 is provided, the peaks of the current density, the vacancy concentration, and the hydrostatic stress also appear in the end area on the upstream side in the current direction I of the perimeter M of the bonding surface 24 (the bonding surface 14B and the bonding surface 18B) of the second electrode 14 serving as the cathode and the wiring member 18.

However, in the semiconductor device 10D of the present embodiment, the area including the perimeter M of each of the bonding surface 18A and the bonding surface 18B of the wiring member 18 has a sectional area larger than that of the body of the wiring member 18.

This configuration is considered to restrain at least one of the concentration of the current density, the thermal stress, the increase and decrease of the vacancy concentration, and the increase and decrease of the hydrostatic stress on each of the bonding surface 18A and the bonding surface 18B of the wiring member 18.

Accordingly, the semiconductor device 10D of the present embodiment can reduce the occurrence of the electromigration.

Fifth Embodiment

Figure 10:
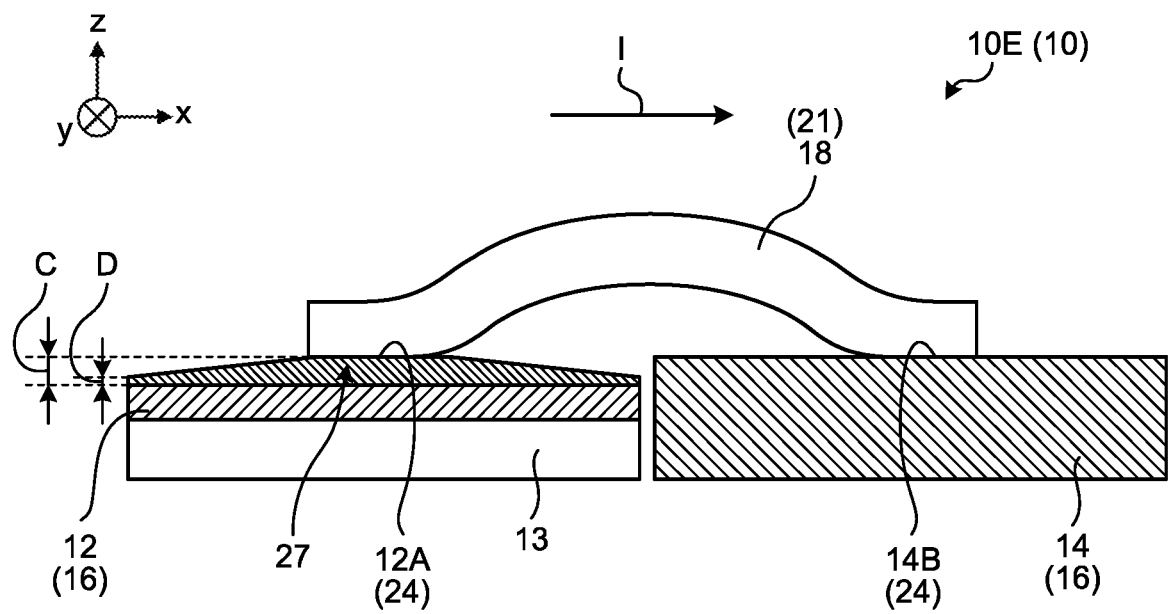
FIG. 10 is a schematic view of a semiconductor device according to a fifth embodiment.

FIG. 10 is a sectional view of a semiconductor device 10E according to a fifth embodiment, and illustrates a section in the same position and direction as those in FIG. 3B. In the present embodiment, a configuration will be described in which an area including the perimeter M of the bonding surface 24 in the electrode 16 is adjusted in thickness to serve as an electromigration reducing area 27 (see C and D). Parts having the same configuration as those of the first embodiment will be denoted by the same reference numerals, and will not be described in detail.

The semiconductor device 10E includes the pair of electrodes 16 (the first electrode 12 and the second electrode 14), and the wiring member 18. In the same way as in the above-described embodiments, the semiconductor device 10E includes the first electrode 12 serving as the above-mentioned surface electrode (semiconductor electrode) on the portion of the end face of the semiconductor 13. The second electrode 14 is the substrate electrode. The semiconductor device 10E has the same configuration as that of the semiconductor device 10 of the first embodiment, except in including the electromigration reducing area 27 instead of the electromigration reducing area 22.

The electromigration reducing area 27 is a portion of the first electrode 12, and is an area including the perimeter M of the bonding surface 12A of the first electrode 12.

The electromigration reducing area 27 is an area that increases in thickness stepwise or in a continuous manner as it approaches the bonding surface 12A from positions distant from the bonding surface 12A toward the upstream and downstream sides in the current direction I.

The electromigration reducing area 27 only needs to be provided on at least one of the first electrode 12 and the second electrode 14, and is not limited to the configuration of being provided on only the first electrode 12.

As described above, in the semiconductor device 10E of the present embodiment, the first electrode 12 serving as the semiconductor electrode is provided on the semiconductor 13, while the second electrode 14 is the substrate electrode.

Therefore, the electromigration reducing area 27 is preferably provided on at least the bonding surface 12A constituting the bonding surface 24 bonded to the first electrode 12 serving as the semiconductor electrode among the bonding surfaces 24 of the wiring member 18.

As described in the first embodiment, when the current flows in the current direction I through the wiring member 18 of the comparative semiconductor device provided with none of the electromigration reducing area 22, the electromigration reducing area 23, the electromigration reducing area 25, and the electromigration reducing area 27, the peaks of the current density, the vacancy concentration, and the hydrostatic stress appear in the perimeter M of the bonding surface 24 (the bonding surface 12A and the bonding surface 18A) of the first electrode 12 serving as the anode and the wiring member 18. When none of the electromigration reducing area 22, the electromigration reducing area 23, the electromigration reducing area 25, and the electromigration reducing area 27 is provided, the peaks of the current density, the vacancy concentration, and the hydrostatic stress also appear in the end area on the upstream side in the current direction I of the perimeter M of the bonding surface 24 (the bonding surface 14B and the bonding surface 18B) of the second electrode 14 serving as the cathode and the wiring member 18.

However, the semiconductor device 10E of the present embodiment includes the electromigration reducing area 27. The electromigration reducing area 27 is a portion of the first electrode 16, and is an area including the perimeter M of the bonding surface 24 of the electrode 16.

This configuration is considered to restrain at least one of the concentration of the current density, the thermal stress, the increase and decrease of the vacancy concentration, and the increase and decrease of the hydrostatic stress on each of the bonding surface 18A and the bonding surface 18B of the wiring member 18.

Accordingly, the semiconductor device 10D of the present embodiment can reduce the occurrence of the electromigration.

The semiconductor device 10E of the present embodiment may have a configuration obtained by further combining the electromigration reducing area 27 with at least one of the electromigration reducing area 22, the electromigration reducing area 23, and the electromigration reducing area 25 described in the above-described embodiments.

Sixth Embodiment

In the above-described embodiments, the configuration has been described as an example in which the conductive connection member 21 is the wiring member 18. In a sixth embodiment, a configuration will be described in which the conductive connection member 21 is the bonding material.

Figure 11A:
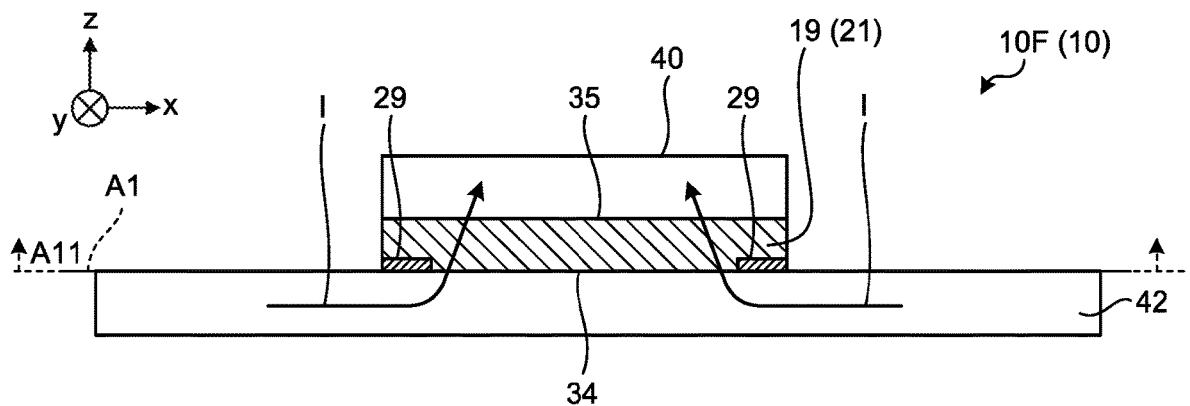
FIG. 11A is a schematic view of a semiconductor device according to a sixth embodiment.
Figure 11B:
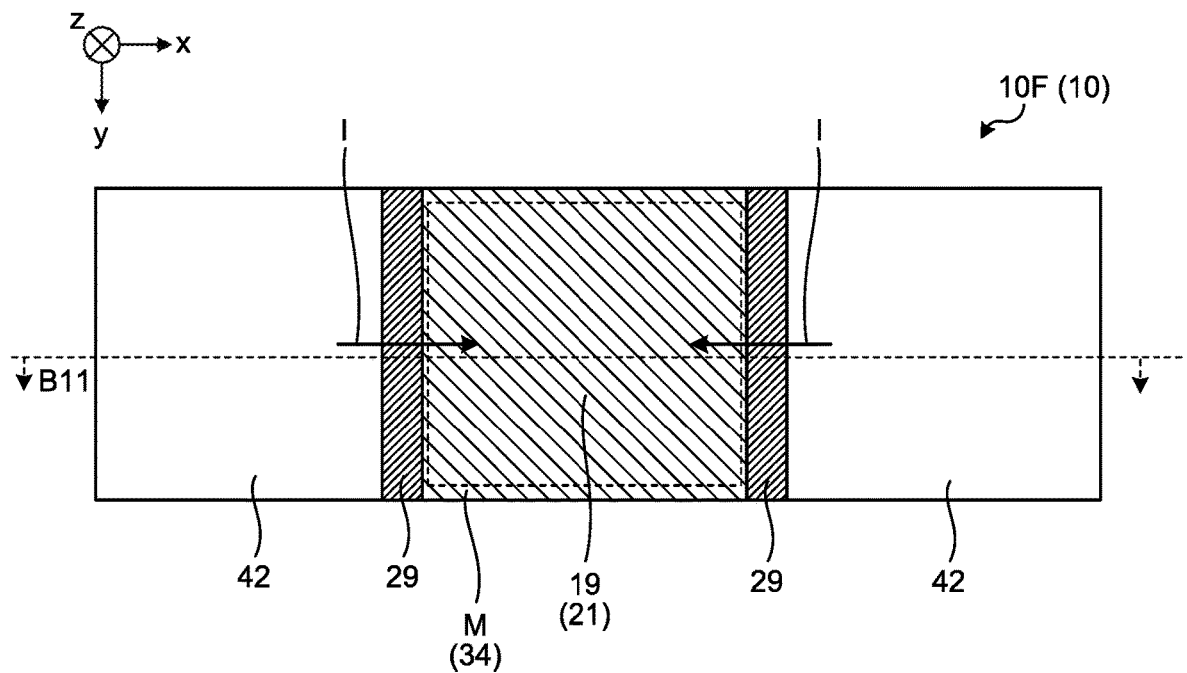
FIG. 11B is another schematic view of the semiconductor device according to the sixth embodiment.

FIG. 11A is a sectional view illustrating an example of a semiconductor device 10F obtained by viewing a dotted line B11 portion of FIG. 11B in the positive y-axis direction. FIG. 11B is a sectional view illustrating the example of the semiconductor device 10F obtained by viewing a dotted line A11 portion of FIG. 11A in the positive z-axis direction (A1).

The semiconductor device 10F includes a semiconductor 40, a substrate electrode 42, and a bonding material 19. The semiconductor device 10F also includes electromigration reducing areas 29.

The semiconductor 40 is the same as the first electrode 12 of the first embodiment serving as the semiconductor electrode. The substrate electrode 42 is the same as the second electrode 14 of the first embodiment serving as the substrate electrode.

The bonding material 19 is an example of the conductive connection member 21. The bonding material 19 is a member for conducting electricity between the semiconductor 40 and the substrate electrode 42. The bonding material 19 is, for example, solder.

The constituent material of the bonding material 19 only needs to be a low melting point material having conductivity, and is not limited. The bonding material 19 is made of a material including, for example, Sn, Ag, Cu, Ni, P, Ge, Bi, In, Ni, Sb, or Pb. The bonding material is not limited in shape and configuration. Examples of the shape and configuration include a paste, a wire, a plate, a ball, a ribbon, and a chip. The shape of the paste, the wire, the plate, the ball, the ribbon, or the chip may be formed in advance, or may be formed when being bonded. The solder formed in shape before being bonded is also generally called a preform solder.

The bonding material 19 may be plated. The type of the plating is not limited. The plating is made of a material, such as Ni, Zn, Cd, ICr, Cu, Ni, Cr, Au, Ag, Pb, or P.

The substrate electrode 42 is bonded to the bonding material 19 on a bonding surface 34. The bonding surface 34 is an area including a surface of which the bonding material 19 is electrically bonded to the substrate electrode 42. The semiconductor 40 is bonded to the bonding material 19 on a bonding surface 35. The bonding surface 35 is an area including a surface of which the bonding material 19 is electrically bonded to the semiconductor 40.

The semiconductor device 10F of the present embodiment includes electromigration reducing areas 29. In the same way as the electromigration reducing area 22, each of the electromigration reducing areas 29 is an area containing a material that reduces the grain boundary diffusion or reduces the electrical conductivity of the base material of the bonding surface 34. An example of the additive is the same as the additive of the first embodiment.

In the present embodiment, the electromigration reducing areas 29 are provided at all sides of the bonding surface 34 of the bonding material 19 in contact with the substrate electrode 42 through which the current mainly passes. That is, in the semiconductor device 10F of the present embodiment, the electromigration reducing areas 29 are provided in at least portions of the perimeter M of the bonding surface 34.

In the semiconductor device 10F, the current direction I is a direction from the substrate electrode 42 toward the semiconductor 40. The inventors have found that the current density is concentrated on the perimeter M of the bonding surface 34 in the process in which the current flows from the substrate electrode 42 into the bonding material 19.

However, in the semiconductor device 10F of the present embodiment, the electromigration reducing areas 29 serving as the areas with the additive added thereto are provided in areas of at least the portions of the perimeter M of the bonding surface 34 of the bonding material 19 bonded to the substrate electrode 42.

This configuration allows the semiconductor device 10F to reduce the occurrence of the electromigration in the same way as in the above-described embodiments.

Modification 3

In the above-described sixth embodiment, the configuration has been described as an example in which the electromigration reducing areas 29 are provided in at least the portions of the perimeter M of the bonding surface 34.

However, the configuration may be such that the electromigration reducing areas 29 are provided in at least portions of the perimeters M of the bonding surface 34 and the bonding surface 35.

In the above-described sixth embodiment, the configuration has been described as an example in which the current flows into the bonding material 19 only from the x-axis direction. However, when the substrate electrode 42 extends in the y-axis direction and the current flows into the bonding material 19 from the y-axis direction, the electromigration reducing areas 29 are preferably provided in at least portions of ends in the y-axis direction of the perimeter M of the bonding material 19. When the current flows into the bonding material 19 from both the x-axis direction and the y-axis direction, the electromigration reducing areas 29 are preferably provided in at least portions of ends in both the x-axis direction and the y-axis direction of the perimeter M of the bonding material 19.

Furthermore, even when the substrate electrode 42 does not extend in the x-axis direction and the y-axis direction, and the current density is not concentrated on the perimeter M, the electromigration reducing areas 29 may be provided in at least portions of the ends of the perimeter M.

The additive may be added to at least portions of the perimeter M of the bonding material 19 in advance before the bonding, or during the bonding, or after the bonding. The additive may be added a plurality of times, or may be separately added to a plurality of areas.

Figure 12A:
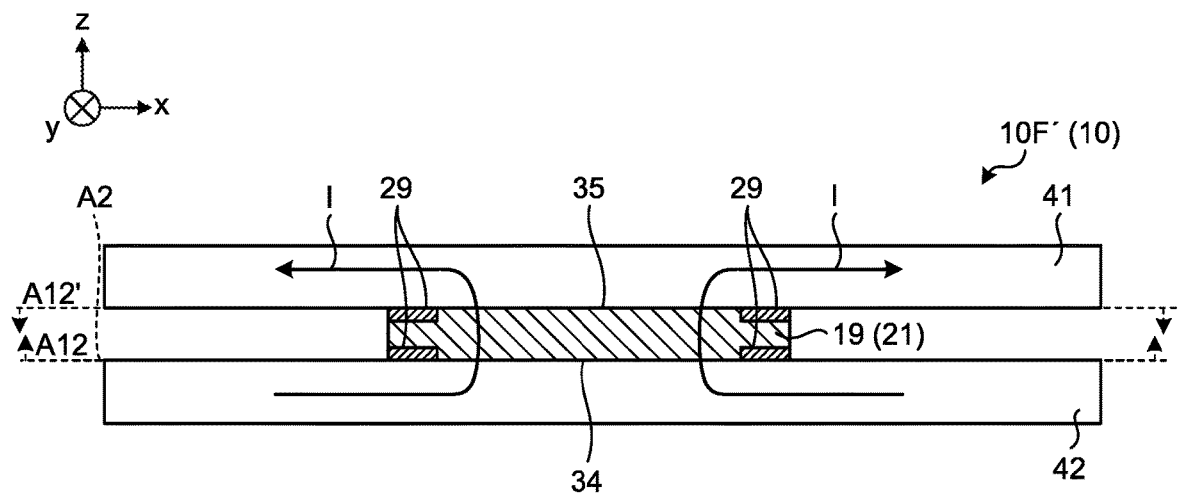
FIG. 12A is a schematic view of a semiconductor device according to still another modification.
Figure 12B:
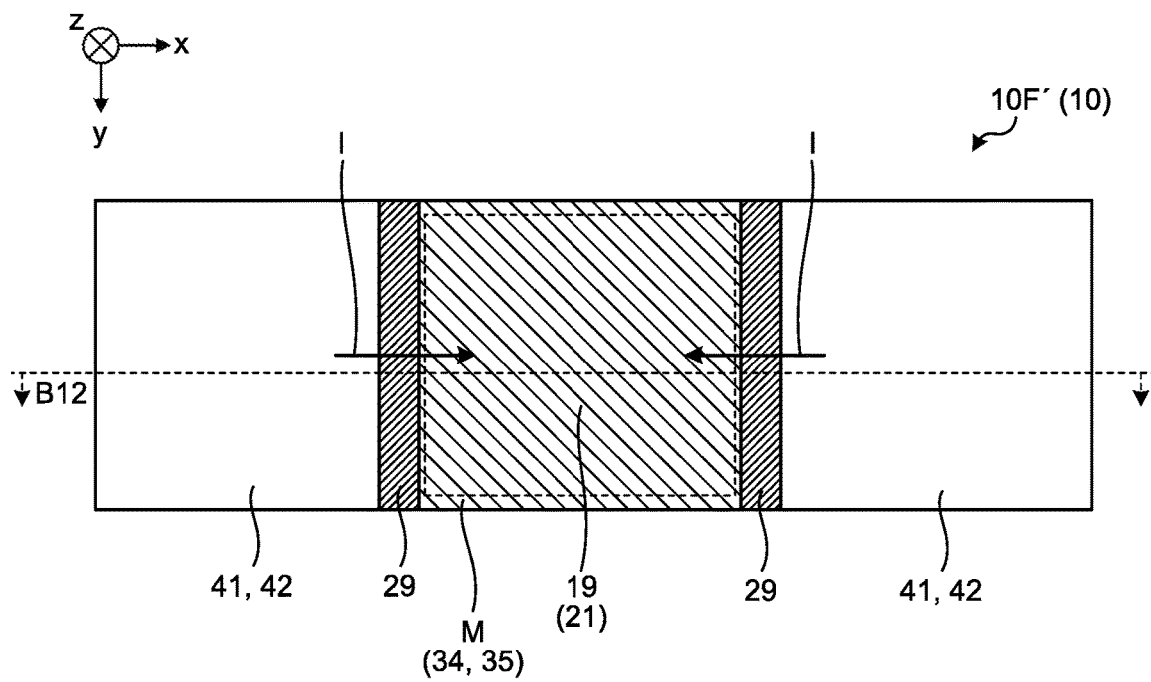
FIG. 12B is another schematic view of the semiconductor device according to the still other modification.

FIG. 12A is a sectional view illustrating an example of a semiconductor device 10F' obtained by viewing a dotted line B12 portion of FIG. 12B in the positive y-axis direction. FIG. 12B is a sectional view illustrating the example of the semiconductor device 10F' obtained by viewing a dotted line A12 portion of FIG. 12A in the positive z-axis direction or viewing a dotted line A12' portion in the negative z-axis direction (A2).

The semiconductor device 10F' differs from the semiconductor device 10F of the sixth embodiment in being provided with a substrate electrode 41 instead of the semiconductor 40. The semiconductor device 10F' also differs from the semiconductor device 10F of the sixth embodiment in being provided with the electromigration reducing areas 29 in at least portions of the perimeters M of both the bonding surface 34 and the bonding surface 35. Except in these differences, the semiconductor device 10F' has the same configuration as that of the semiconductor device 10F of the sixth embodiment.

In the present modification, the electromigration reducing areas 29 are provided on both the bonding surface 34 of the bonding material 19 in contact with the substrate electrode 42 and the bonding surface 35 of the bonding material 19 in contact with the substrate electrode 41. In detail, in the present modification, the electromigration reducing areas 29 are provided in at least the portions of the perimeters M of both the bonding surface 34 and the bonding surface 35.

As a result, for the same reason as that of the fact described in the above-described sixth embodiment, the semiconductor device 10F' can reduce the occurrence of the electromigration in the same way as in the above-described embodiments.

In the present modification, the configuration has been described as an example in which the current flows into the bonding material 19 from the x-axis direction of both the substrate electrodes 41 and 42. However, when one of the substrate electrodes 41 and 42 extends in the x-axis direction, the electromigration reducing areas 29 are preferably provided in at least portions of ends in the x-axis direction of the perimeter M of the bonding material 19 on the extending one of the substrate electrodes 41 and 42. When one of the substrate electrodes 41 and 42 extends in the y-axis direction and the current flows into the bonding material 19 from the y-axis direction, the electromigration reducing areas 29 are preferably provided in at least portions of ends in the y-axis direction of the perimeter M of the bonding material 19. When the current flows into the bonding material 19 from both the x-axis direction and the y-axis direction of one of the substrate electrodes 41 and 42, the electromigration reducing areas 29 are preferably provided in at least the portions of the ends in both the x-axis direction and the y-axis direction of the perimeter M of the bonding material 19.

Furthermore, even when one of the substrate electrodes 41 and 42 does not extend in the x-axis direction and the y-axis direction, and the current density is not concentrated on the perimeter M, the electromigration reducing areas 29 may be provided in at least portions of the ends of the perimeter M.

The additive may be added to at least portions of the perimeter M of the bonding material 19 in advance before the bonding, or during the bonding, or after the bonding. The additive may be added a plurality of times, or may be separately added to a plurality of areas.

Seventh Embodiment

In a seventh embodiment, the following describes an inspection device that inspects deterioration of the conductive connection member 21 of the semiconductor device 10 (any one of the semiconductor devices 10A to 10F') described in the above-described embodiments.

Figure 13:
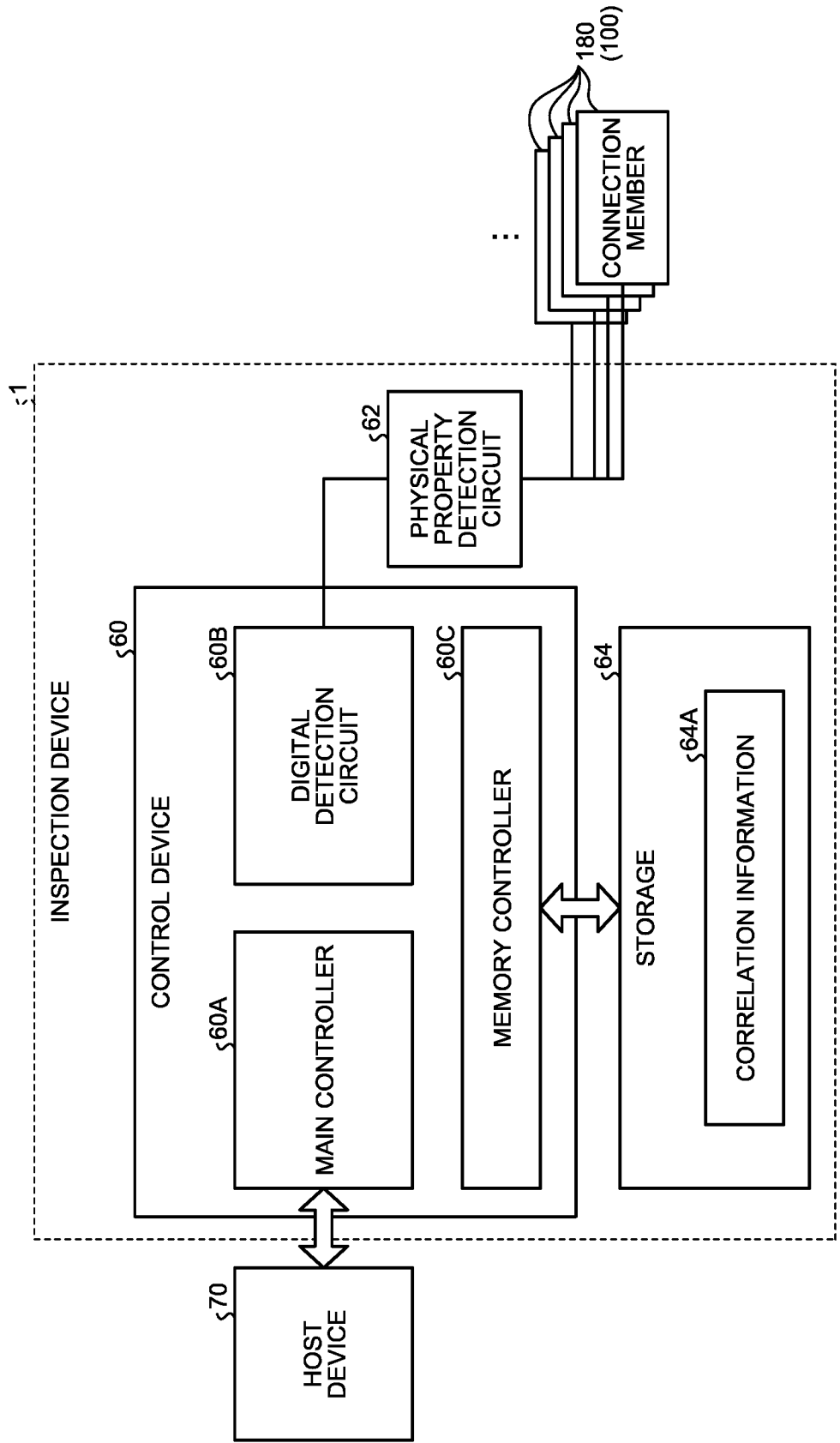
FIG. 13 is a schematic diagram of an inspection device according to a seventh embodiment.

FIG. 13 is a schematic diagram illustrating an example of an inspection device 1 of the present embodiment.

The inspection device 1 includes a control device 60, a physical property detection circuit 62, and a storage 64.

The storage 64 is a memory area including, for example, a dynamic random access memory (DRAM) (including a synchronous dynamic random access memory (SDRAM)) and/or a static random access memory (SRAM). The storage 64 is, however, not limited to these memories. Various storage devices, such as a flash memory, a hard disk drive, and a magnetic tape recorder can be used as the storage 64.

In the present embodiment, the storage 64 stores correlation information 64A in advance. Details of the correlation information 64A will be described later.

The physical property detection circuit 62 is connected to conductive connection members 180 of a plurality of comparative semiconductor devices 100. Each of the comparative semiconductor devices 100 has the same configuration as that of the semiconductor device 10 of the above-described embodiments, except in being provided with none of the electromigration reducing areas (the electromigration reducing area 22, the electromigration reducing area 23, the electromigration reducing area 25, the electromigration reducing area 27, and the electromigration reducing areas 29) described in the above-described embodiments.

The control device 60 may be, for example, an integrated circuit such as a system-on-chip (SoC). The control device 60 includes a main controller 60A, a digital detection circuit 60B, and a memory controller 60C. The main controller 60A, the digital detection circuit 60B, and the memory controller 60C are connected so as to be capable of communicating with one another through, for example, an internal bus (not illustrated).

The memory controller 60C is configured using, for example, an information processing device such as a digital signal processor (DSP) or a central processing unit (CPU), a memory area such as a random access memory (RAM), and a wireless or wired interface circuit or network interface card (NIC). The memory controller 60C integrally controls the components included in the control device 60, and in addition, wirelessly or wiredly transmits and receives, for example, data and commands to and from an external host device 70.

The memory controller 60C controls writing and reading of data to and from the storage 64.

The digital detection circuit 60B is connected to the physical property detection circuit 62, and converts an analog physical property detection result detected by the physical property detection circuit 62 into a digital physical property detection result.

Figure 14:
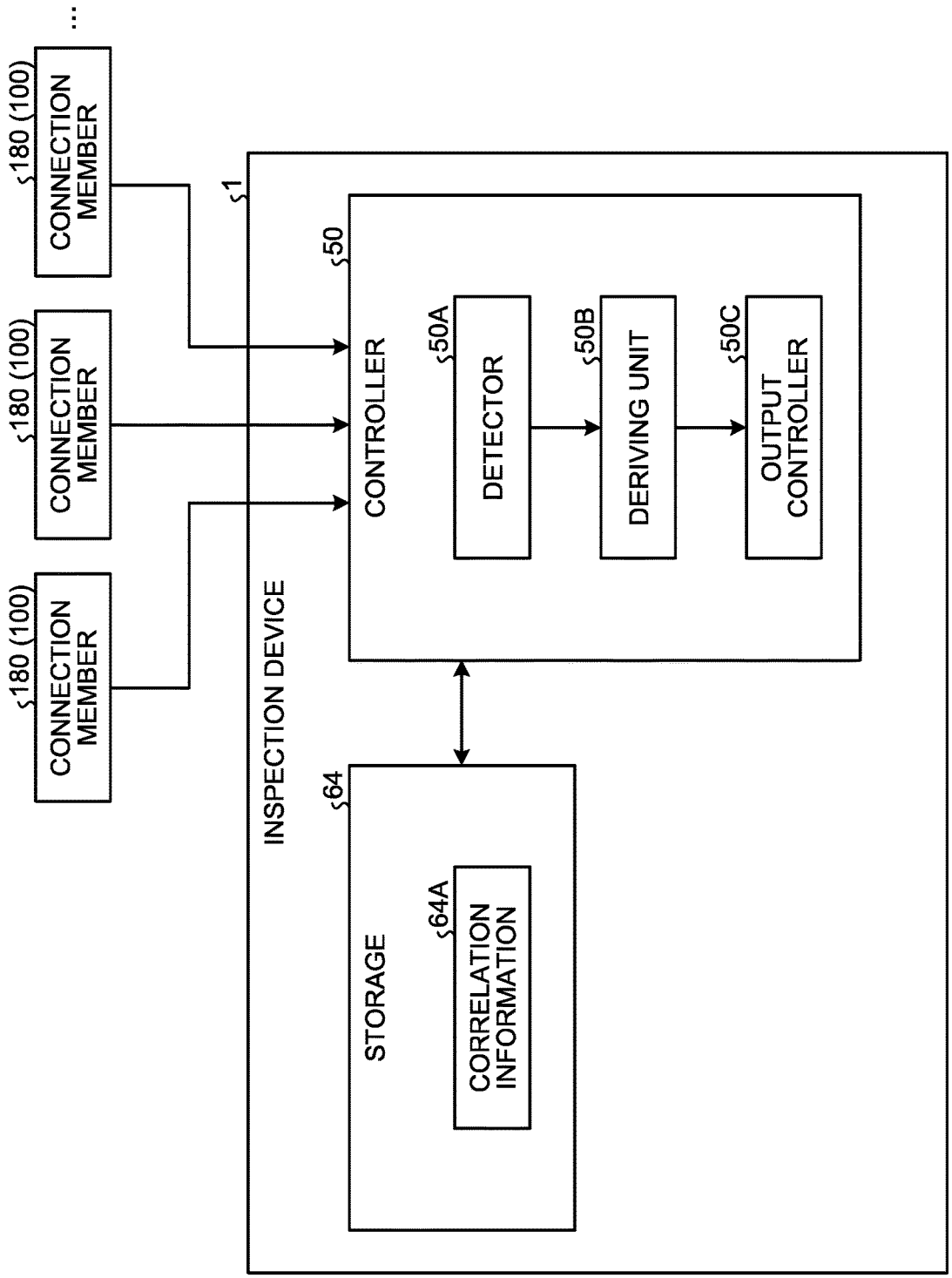
FIG. 14 is a block diagram illustrating a functional configuration of the inspection device according to the seventh embodiment.

FIG. 14 is a block diagram illustrating a functional configuration of the inspection device 1.

The inspection device 1 includes the storage 64 and a controller 50. The controller 50 and the storage 64 are connected so as to be capable of communicating with each other. The storage 64 is the same as the above-described storage 64. The controller 50 corresponds to the above-described control device 60.

The controller 50 includes a detector 50A, a deriving unit 50B, and an output controller 50C.

At least one of the detector 50A, the deriving unit 50B, and the output controller 50C is implemented by, for example, one or a plurality of processors. For example, each of the above-mentioned units may be implemented by causing a processor such as a CPU to execute a computer program, that is, by software. Each of the above-mentioned units may be implemented by a processor such as a dedicated integrated circuit (IC). Each of the above-mentioned units may be implemented using both hardware and software. When a plurality of processors are used, each of the processors may implement one of the units, or may implement two or more of the units.

The detector 50A is connected to the conductive connection members 180 of the comparative semiconductor devices 100. The detector 50A detects the physical property of each of the conductive connection members 180 of the comparative semiconductor devices 100. The physical property of the conductive connection member 180 refers to at least one of a current flowing through, a voltage across, and an electrical resistance value of the conductive connection member 180, the number of strain cycles in each of a plurality of different directions, the number of stress cycles in each of a plurality of different directions, and the number of temperature cycles. The number of cycles refers to the number of times when one periodic time is defined as one cycle.

Each of the comparative semiconductor devices 100 may have a configuration provided with a sensor for detecting the physical property, such as the temperature, the strain, or the resistance value. In this case, the detector 50A only needs to acquire the physical property of the conductive connection member 180 from the sensor of the comparative semiconductor device 100 through the physical property detection circuit 62.

The deriving unit 50B derives a deterioration value of the conductive connection member 21 of the semiconductor device 10 based on the detection result of the detector 50A. The semiconductor device 10 refers to any one of the semiconductor devices 10A to 10F' described in the above-described embodiments. The deterioration value refers to a value representing a level of deterioration of the conductive connection member 21 provided in the semiconductor device 10. The deterioration value is specifically a value representing, for example, a failure probability, a disconnection state, a deterioration state, or a service life of the conductive connection member 21.

The deriving unit 50B uses the detection result of the detector 50A and the correlation information 64A to derive the deterioration value of the conductive connection member 21 of the semiconductor device 10.

The correlation information 64A is information representing a correlation between the physical property of the conductive connection member 180 and the deterioration value of the conductive connection member 21 of the semiconductor device 10. The correlation information 64A is, for example, a database associating the physical property of the conductive connection member 180 of the comparative semiconductor device 100 with the deterioration value of the conductive connection member 21 of the semiconductor device 10. The correlation information 64A may be a function for deriving the deterioration value of the conductive connection member 21 from the physical property of the conductive connection member 180.

The deriving unit 50B may use the detection result of the detector 50A and a cumulative damage rule algorithm derived in advance to derive the deterioration value of the conductive connection member 21. The cumulative damage rule algorithm is an algorithm for estimating cumulative damage of the conductive connection member 21 caused by repetitive use thereof as the deterioration value.

The controller 50 only needs to create the correlation information 64A in advance based on experimental results of the physical property of the conductive connection member 180 of one or each of the comparative semiconductor devices 100 connected to the inspection device 1 and the deterioration value of the conductive connection member 21 in the semiconductor device 10, and store the created correlation information 64A in the storage 64.

The output controller 50C outputs the deterioration value derived by the deriving unit 50B. The output controller 50C outputs the deterioration value derived by the deriving unit 50B to, for example, the host device 70. Thus, the deriving unit 50B can output the deterioration value of, for example, the service life of the conductive connection member 21. As a result, the inspection device 1 can reduce the occurrence of the electromigration in the semiconductor device 10 by causing the semiconductor device 10 to be adjusted according to the deterioration value.

The following describes an example of a flow of information processing performed by the controller 50 of the inspection device 1.

Figure 15:
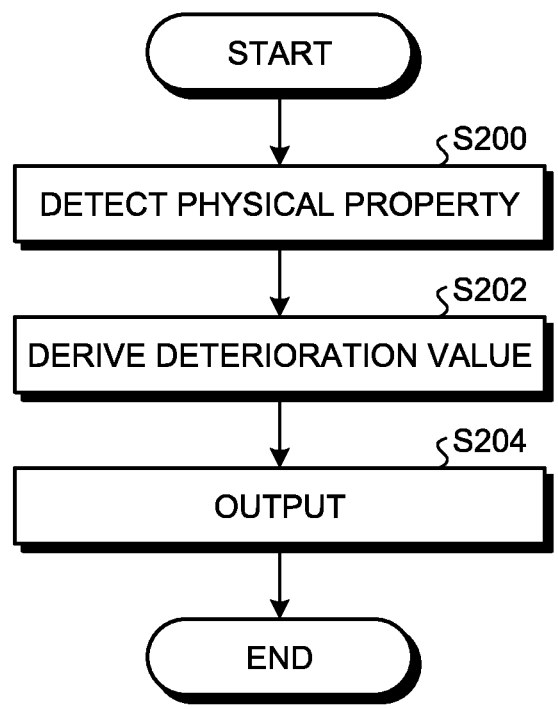
FIG. 15 is a flowchart illustrating a flow of information processing according to the seventh embodiment.

FIG. 15 is a flowchart illustrating the flow of the information processing performed by the controller 50 of the inspection device 1.

The detector 50A detects the physical property of the conductive connection member 180 of the comparative semiconductor device 100 (Step S200). The deriving unit 50B uses the detection result of the physical property detected at Step S200 and the correlation information 64A to derive the deterioration value of the conductive connection member 21 of the semiconductor device 10 (Step S202). The output controller 50C outputs the deterioration value derived at Step S202 (Step S204). Then, this routine ends.

As described above, the inspection device 1 of the present embodiment includes the detector 50A and the deriving unit 50B. The detector 50A is connected to the conductive connection member 180 of the comparative semiconductor device 100 including the pair of electrodes 16 and the conductive connection member 180 electrically bonded to the pair of electrodes 16, and detects the physical property of the conductive connection member 180. The deriving unit 50B derives the deterioration value of the conductive connection member 21 of the semiconductor device 10 based on the detection result of the detector 50A.

In this way, the inspection device 1 of the present embodiment uses the physical property of the conductive connection member 180 of the comparative semiconductor device 100 to derive the deterioration value of, for example, the service life of the conductive connection member 21 of the semiconductor device 10.

The conductive connection member 180 of the comparative semiconductor device 100 has the configuration not provided with the electromigration reducing area described in the above-described embodiments, and therefore, is a member having a shorter service life than that of the conductive connection member 21 of the semiconductor device 10. The inspection device 1 of the present embodiment uses the detection result of the physical property of the conductive connection member 180 of the comparative semiconductor device 100 to derive the deterioration value of the conductive connection member 21 of the semiconductor device 10 according to the above-described embodiments. As a result, the inspection device 1 can reduce the occurrence of the electromigration in the semiconductor device 10 by causing the semiconductor device 10 to be adjusted according to the derived deterioration value.

Accordingly, the inspection device 1 of the present embodiment can reduce the occurrence of the electromigration in the conductive connection member 21 of the semiconductor device 10.

The inspection device 1 only needs to use at least one physical property detection result of the conductive connection member 180 of the comparative semiconductor device 100 to derive the deterioration value of the conductive connection member 21 of the semiconductor device 10. Therefore, the physical property detection circuit 62 of the inspection device 1 may have a configuration of being electrically connected to one of more of the conductive connection members 180 of the comparative semiconductor devices 100 and one or more of the conductive connection members 21 of the comparative semiconductor devices 100. In this case, the correlation information 64A only needs to be information representing a correlation of the physical properties of the comparative semiconductor device 100 and the semiconductor device 10, electrically connected to the physical property detection circuit 62, with the deterioration value of the conductive connection member 21 of the semiconductor device 10. The deriving unit 50B only needs to use the detection result of the detector 50A and the correlation information 64A to derive the deterioration value of the conductive connection member 21 of the semiconductor device 10.

Applications

Applications of the semiconductor device 10 (any one of the semiconductor devices 10A to 10F') described in the above-described embodiments are not limited. For example, the semiconductor device 10 is applied to power modules including various semiconductor devices, such as metal-oxide-semiconductor field-effect transistors (MOSFETs) and gate bipolar transistors (GBTs). The power modules to which the semiconductor device 10 is applied is suitably applicable as core components in power electronics fields, such as industrial equipment, railways, and automobiles. In these power modules, reduction in size and increase in power may lead to a higher current density and higher operating temperature. However, applying the semiconductor device 10 of the above-described embodiments to these modules can reduce the occurrence of the electromigration caused by the higher current density and the higher operating temperature. Accordingly, applying the semiconductor device 10 of the above-described embodiments can increase the reliability of these modules.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   a pair of electrodes; and
   a conductive connection member electrically bonded to the pair of electrodes,
   wherein at least a portion of a perimeter of a bonding surface of at least one of the pair of electrodes and the conductive connection member comprises an electromigration reducing area, and
   the perimeter of the bonding surface is a belt-like area having a predetermined width extending toward an inside of the bonding surface from an outer circumference of the bonding surface.

2. The semiconductor device according to claim 1, wherein the electromigration reducing area is an area of the perimeter of the bonding surface.

3. The semiconductor device according to claim 1, wherein the electromigration reducing area is an end area on an upstream side in a current direction of the perimeter of the bonding surface of the conductive connection member.

4. The semiconductor device according to claim 1, wherein the electromigration reducing area is an area of at least a portion of the perimeter of the bonding surface of at least either of the pair of electrodes and the conductive connection member.

5. The semiconductor device according to claim 1, wherein the electromigration reducing area is an additive containing area containing an additive for reducing diffusion of the electromigration or reducing electrical conductivity of a base material of the bonding surface.

6. The semiconductor device according to claim 5, wherein a content of the additive contained in the electromigration reducing area is 0.1% or greater by mass and 20.0% or lower by mass.

7. The semiconductor device according to claim 5, wherein the additive is at least one type selected from a group comprising Al, Cu, Si, Ni, Cr, Mg, Au, Ag, Ta, Fe, a molybdenum-tungsten alloy (MoW), Ti, Be, Nd, Fr, Nb, and Co.

8. The semiconductor device according to claim 5, wherein
   the base material is Al, and
   the additive is at least either one of at least one type selected from a group comprising Si, Cu, Nd, Mg, Fr, Ti, Mo, Ta, Nb, W, Ni, and Co, and an alloy of at least one type selected from the group and Al.

9. The semiconductor device according to claim 5, wherein
   the base material is Cu, and
   the additive is at least either one of at least one type selected from a group comprising Si, Al, Nd, Mg, Fr, Ti, Mo, Ta, Nb, W, Ni, and Co, and an alloy of at least one type selected from the group and Al.

10. The semiconductor device according to claim 5, wherein
    the base material mainly contains Sn, and
    the additive is at least either one of at least one type selected from a group comprising Si, Al, Cu, Nd, Mg, Fr, Ti, Mo, Ta, Nb, W, Ni, and Co, and an alloy of at least one type selected from the group and Al.

11. The semiconductor device according to claim 5, wherein the additive is added to the base material in advance before bonding.

12. The semiconductor device according to claim 1, wherein the conductive connection member is a wiring member or a bonding material.

13. The semiconductor device according to claim 1, wherein
    the conductive connection member is a wiring member that electrically bonds each of the pair of electrodes, and
    the electromigration reducing area is an area of at least a portion of the perimeter of the bonding surface of the wiring member, and is an area having a fillet-shaped sectional shape.

14. The semiconductor device according to claim 1, wherein
    the conductive connection member is a wiring member that electrically bonds each of the pair of electrodes, and
    the electromigration reducing area is an area that includes the perimeter of the bonding surface of the wiring member and that is larger than a sectional area of a body of the wiring member.

15. The semiconductor device according to claim 1, wherein the electromigration reducing area is an area that includes the perimeter of the bonding surface of one of the electrodes and that is thicker than an area exposed from the bonding surface of the electrode.

16. An inspection device comprising:
    a detector connected to a conductive connection member of a comparative semiconductor device comprising a pair of electrodes and the conductive connection member electrically bonded to the pair of electrodes, the detector being configured to detect a physical property of the conductive connection member of the comparative semiconductor device, at least a portion of a perimeter of a bonding surface of at least one of the pair of electrodes and the conductive connection member not including an electromigration reducing area; and a deriving unit configured to derive a deterioration value of a conductive connection member of a semiconductor device by using a detection result of the detector and correlation information representing a correlation of the physical property of the conductive connection member of the comparative semiconductor device with a deterioration value of the conductive connection member of the semiconductor device, the semiconductor device including a pair of electrodes and the conductive connection member electrically bonded to the pair of electrodes, at least a portion of a perimeter of a bonding surface of at least one of the pair of electrodes and the conductive connection member including an electromigration reducing area, and the perimeter of the bonding surface being a belt-like area having a predetermined width extending toward an inside of the bonding surface from an outer circumference of the bonding surface.

* * * * *